US012805171B2

(12) United States Patent
Lee

(10) Patent No.: US 12,805,171 B2
(45) Date of Patent: Nov. 17, 2026

(54) DISPLAY DEVICE

(71) Applicant: Samsung Display Co., LTD., Yongin-si (KR)

(72) Inventor: Hyeonbum Lee, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 357 days.

(21) Appl. No.: 18/420,143

(22) Filed: Jan. 23, 2024

(65) Prior Publication Data

US 2024/0397803 A1 Nov. 28, 2024

(30) Foreign Application Priority Data

May 23, 2023 (KR) ........................ 10-2023-0066305

(51) Int. Cl.
*H10K 59/80* (2023.01)
*G09G 3/3233* (2016.01)
(Continued)

(52) U.S. Cl.
CPC ....... *H10K 59/8792* (2023.02); *G09G 3/3233* (2013.01); *H10K 59/122* (2023.02);
(Continued)

(58) Field of Classification Search
CPC ............. H10K 59/8792; H10K 59/122; H10K 59/873; H10K 59/35; G09G 3/3233; G09G 2300/0842
See application file for complete search history.

(56) References Cited

U.S. PATENT DOCUMENTS 10,804,330 B2 10/2020 Yang et al.
10,854,687 B2 12/2020 Joo et al.
(Continued)

FOREIGN PATENT DOCUMENTS

CN 111969024 A 11/2020
KR 1020100048608 A 5/2010
(Continued)

OTHER PUBLICATIONS

Office Action dated Jul. 28, 2026 from the Korean Intellectual Property Office (KIPO) for Korean Patent Application No. 10-2023-0066305, 19 pages.

*Primary Examiner* — Fernando L Toledo
*Assistant Examiner* — Adam S Bowen
(74) *Attorney, Agent, or Firm* — CANTOR COLBURN LLP

(57) ABSTRACT

A display device includes: a substrate including a first area including an emission area and a non-emission area; first to third light emitting elements disposed in the first area; a pixel defining layer disposed in the non-emission area; an encapsulation layer disposed on the first to third light emitting elements; and a light blocking layer disposed in the first area. At least one of a first distance from an upper surface of a pixel electrode of the first light emitting element to a lower surface of the light blocking layer and a second distance from an upper surface of a pixel electrode of the second light emitting element to the lower surface of the light blocking layer is different from a third distance from an upper surface of a pixel electrode of the third light emitting element to the lower surface of the light blocking layer.

19 Claims, 15 Drawing Sheets

(51) Int. Cl.
*H10K 59/122* (2023.01)
*H10K 59/35* (2023.01)

(52) U.S. Cl.
CPC ... *H10K 59/873* (2023.02); *G09G 2300/0842* (2013.01); *H10K 59/35* (2023.02)

(56) References Cited

U.S. PATENT DOCUMENTS

| | | | |
|---|---|---|---|
| 11,991,904 | B2 | 5/2024 | Lee et al. |
| 2010/0109511 | A1 | 5/2010 | Kim et al. |
| 2014/0332768 | A1 | 11/2014 | Kwon et al. |
| 2018/0062116 | A1* | 3/2018 | Park ................ H10K 59/80521 |
| 2023/0044947 | A1 | 2/2023 | Lee |

FOREIGN PATENT DOCUMENTS

| | | | |
|---|---|---|---|
| KR | 20140133052 | A | 11/2014 |
| KR | 1020190072821 | A | 6/2019 |
| KR | 1020210017493 | A | 2/2021 |
| KR | 1020210072544 | A | 6/2021 |
| KR | 1020220060626 | A | 5/2022 |
| KR | 1020220062241 | A | 5/2022 |

* cited by examiner

DISPLAY DEVICE

This application claims priority to Korean Patent Application No. 10-2023-0066305, filed on May 23, 2023, and all the benefits accruing therefrom under 35 U.S.C. § 119, the content of which in its entirety is herein incorporated by reference.

BACKGROUND

1. Field

The disclosure relates to a display device. More specifically, the present invention relates to a display device which provides visual information.

2. Description of the Related Art

As information technology develops, the importance of a display device as a connection medium between a user and information is being highlighted. For example, the use of display devices such as the like a liquid crystal display device ("LCD"), an organic light emitting display device ("OLED"), a plasma display device ("PDP"), a quantum dot display device is increasing.

SUMMARY

Embodiments provide a display device which facilitates viewing angle adjustment and has improved display quality.

A display device according to an embodiment includes: a substrate including a first area including an emission area and a non-emission area; first to third light emitting elements disposed in the first area on the substrate and configured to provide light of different colors to the emission area of the first area; a pixel defining layer disposed in the non-emission area on the substrate; an encapsulation layer disposed on the first to third light emitting elements; and a light blocking layer disposed in the first area on the encapsulation layer and defining emission openings corresponding to the first to third light emitting elements. At least one of a first distance from an upper surface of a pixel electrode of the first light emitting element to a lower surface of the light blocking layer and a second distance from an upper surface of a pixel electrode of the second light emitting element to the lower surface of the light blocking layer may be different from a third distance from an upper surface of a pixel electrode of the third light emitting element to the lower surface of the light blocking layer.

In an embodiment, the third distance may be shorter than each of the first distance and the second distance.

In an embodiment, the upper surface of the pixel electrode of the first light emitting element may have a first height from an upper surface of the substrate, the upper surface of the pixel electrode of the second light emitting element may have a second height from the upper surface of the substrate, the upper surface of the pixel electrode of the third light emitting element may have a third height from the upper surface of the substrate, and at least one of the first height and the second height may be different from the third height.

In an embodiment, the third height may be greater than each of the first height and the second height.

In an embodiment, the display device may further include: a second area, of the substrate, including an emission area and a non-emission area; and fourth to sixth light emitting elements disposed in the second area on the substrate, and configured to provide light of different colors to the emission area of the second area, and the light blocking layer may not be disposed in the second area.

In an embodiment, each of an upper surface of a pixel electrode of the fourth light emitting element, an upper surface of a pixel electrode of the fifth light emitting element, and an upper surface of a pixel electrode of the sixth light emitting element may have a fourth height equal to the third height from the upper surface of the substrate.

In an embodiment, the pixel defining layer may define a first pixel opening exposing a portion of the pixel electrode of the first light emitting element, a second pixel opening exposing a portion of the pixel electrode of the second light emitting element, and a third pixel opening exposing a portion of the pixel electrode of the third light emitting element, and a planar area of the third pixel opening may be smaller than each of a planar area of the first pixel opening and a planar area of the second pixel opening.

In an embodiment, the first light emitting element may be configured to provide red light, the second light emitting element may be configured to provide blue light, and the third light emitting element may be configured to provide green light.

In an embodiment, the display device may further include: a conductive pattern disposed under the first to third light emitting elements and in contact with the first to third light emitting elements; and an insulating layer covering the conductive pattern and defining at least one trench located in the first area, and the pixel electrode of the first light emitting element and the pixel electrode of the second light emitting element may be disposed in the trench.

In an embodiment, a portion of the pixel defining layer may be disposed in the trench.

In an embodiment, the display device may further include: a conductive pattern disposed under the first to third light emitting elements and in contact with the first to third light emitting elements; a first insulating layer covering the conductive pattern; and a second insulating layer disposed on the first insulating layer and defining at least one hole exposing a portion of the first insulating layer in the first area, and the pixel electrode of the first light emitting element and the pixel electrode of the second light emitting element may be disposed in the hole.

In an embodiment, a portion of the pixel defining layer may be disposed in the hole.

In an embodiment, a display device includes: a substrate including a first area including an emission area and a non-emission area; first to third light emitting elements disposed in the first area on the substrate and configured to provide light of different colors to the emission area of the first area; a pixel defining layer disposed in the non-emission area on the substrate; an encapsulation layer disposed on the first to third light emitting elements; and a light blocking layer disposed in the first area on the encapsulation layer and defining emission openings corresponding to the first to third light emitting elements. A first distance from an upper surface of a pixel electrode of the first light emitting element to a lower surface of the light blocking layer, a second distance from an upper surface of a pixel electrode of the second light emitting element to the lower surface of the light blocking layer, and a third distance from an upper surface of a pixel electrode of the third light emitting element to the lower surface of the light blocking layer are different from each other.

In an embodiment, the third distance may be shorter than each of the first distance and the second distance, and the second distance may be shorter than the first distance.

In an embodiment, the upper surface of the pixel electrode of the first light emitting element has a first height from an upper surface of the substrate, the upper surface of the pixel electrode of the second light emitting element may have a second height from the upper surface of the substrate, the upper surface of the pixel electrode of the third light emitting element may have a third height from the upper surface of the substrate, and the first height, the second height, and the third height may be different from each other.

In an embodiment, the third height may be greater than each of the first height and the second height, and the second height may be greater than the first height.

In an embodiment, the pixel defining layer may define a first pixel opening exposing a portion of the pixel electrode of the first light emitting element, a second pixel opening exposing a portion of the pixel electrode of the second light emitting element, and a third pixel opening exposing a portion of the pixel electrode of the third light emitting element, and a planar area of the first pixel opening, a planar area of the second pixel opening, and a planar area of the third pixel opening may be different from each other.

In an embodiment, the first light emitting element may be configured to provide red light, the second light emitting element may be configured to provide blue light, and the third light emitting element may be configured to provide green light.

In an embodiment, the display device may further include: a second area, of the substrate, including an emission area and a non-emission area; and fourth to sixth light emitting elements disposed in the second area on the substrate, and configured to provide light of different colors to the emission area of the second area, and the light blocking layer may not be disposed in the second area.

In an embodiment, the display device may further include: a conductive pattern disposed under the first to third light emitting elements and in contact with the first to third light emitting elements; and an insulating layer covering the conductive pattern and defining at least one trench located in the first area, and two of the pixel electrode of the first light emitting element, the pixel electrode of the second light emitting element, and the pixel electrode of the third light emitting element may be disposed in the trench.

In an embodiment, a portion of the pixel defining layer may be disposed in the trench.

The display device according to embodiments may operate in a private driving mode that provides a narrow viewing angle in at least some directions. For example, by including a light blocking layer selectively disposed in a specific area of a display area, user's field of view may be narrowed or blocked when viewed from some directions.

In addition, according to the display device, in the area where the light blocking layer is disposed, considering difference of sizes (planar areas) between pixel openings, difference between a level at which one pixel electrode is disposed and a level at which another pixel electrode is disposed may be realized. Accordingly, luminance deviation for each azimuth of the display device due to difference of sizes (planar areas) between the pixel openings may be reduced or prevented. That is, in the private driving mode, the luminance deviation for each azimuth of the display device may be reduced or prevented. Accordingly, the display quality of the display device may be improved. Additionally, a viewing angle may be more easily adjusted in the private driving mode. Therefore, the viewing angle adjustment effect may be improved.

It is to be understood that both the foregoing general description and the following detailed description are exemplary and explanatory and are intended to provide further explanation of the invention as claimed.

BRIEF DESCRIPTION OF THE DRAWINGS

Illustrative, non-limiting embodiments will be more clearly understood from the following detailed description taken in conjunction with the accompanying drawings.

DETAILED DESCRIPTION

Figure 1:
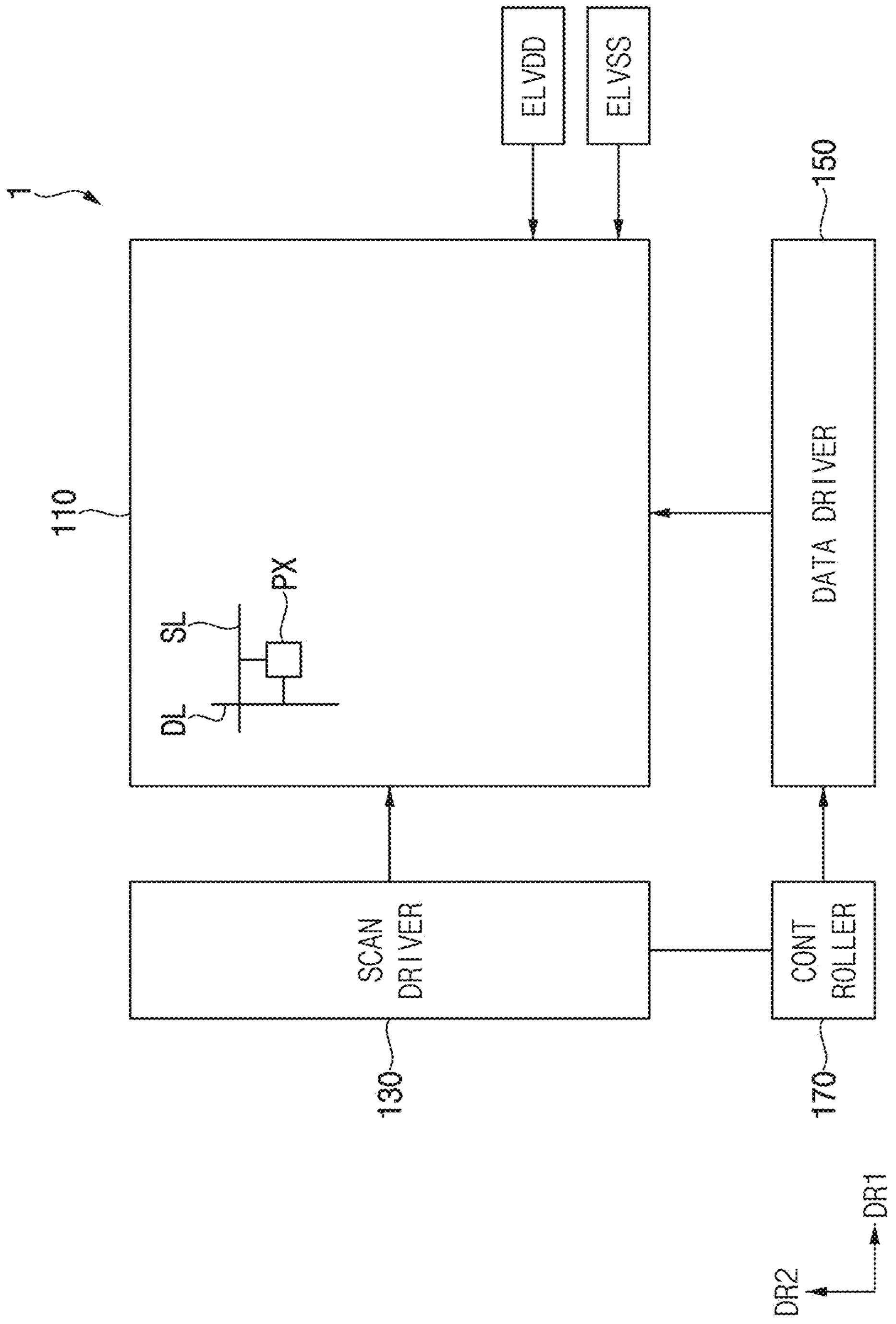
FIG. 1 is a block diagram illustrating a display device according to an embodiment.

It will be understood that when an element is referred to as being "on" another element or "connected to" another element, it can be directly on or directly connected to the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

FIG. 1 is a block diagram illustrating a display device according to an embodiment.

Referring to FIG. 1, a display device 1 may include a display part 110, a scan driver 130, a data driver 150, and a controller 170.

The display part 110 may have pixels PX and signal lines capable of applying electrical signals to the pixels PX.

The pixels PX may be repeatedly arranged in a first direction DR1 and a second direction DR2. The signal lines may include scan lines SL extending in the first direction DR1 and data lines DL extending in the second direction DR2. The scan lines SL may be arranged to be spaced apart along the second direction DR2 and transmit a scan signal to the pixels PX. The data lines DL may be arranged to be spaced apart along the first direction DR1 and transmit a data signal to the pixels PX. Each of the pixels PX may be connected to at least one corresponding scan line among the scan lines SL and at least one corresponding data line among the data lines DL.

A first power voltage ELVDD and a second power voltage ELVSS may be applied to the pixels PX of the display part 110. The first power voltage ELVDD may be a high-level voltage provided to a first electrode (a pixel electrode or an anode) of a light emitting element included in each of the pixels PX. The second power voltage ELVSS may be a low-level voltage provided to a second electrode (an opposite electrode or a cathode) of the light emitting element included in each of the pixels PX. The first power voltage ELVDD and the second power voltage ELVSS may be driving voltages for causing the pixels PX to emit light.

The scan driver 130 may be connected to the scan lines SL, generate the scan signal in response to a scan control signal provided from the controller 170, and sequentially supplies the scan signal to the scan lines SL.

The data driver 150 may be connected to the data lines DL and generate the data signal in response to a data control signal provided from the controller 170, and sequentially supplies the data signal to the data lines DL.

Hereinafter, a display device according to an embodiment will be described by taking an organic light emitting display device as an example, but the display device of the present invention is not limited thereto. For another example, the display device of the present invention may be an inorganic light emitting display, a quantum dot light emitting display, or the like.

Figure 2:
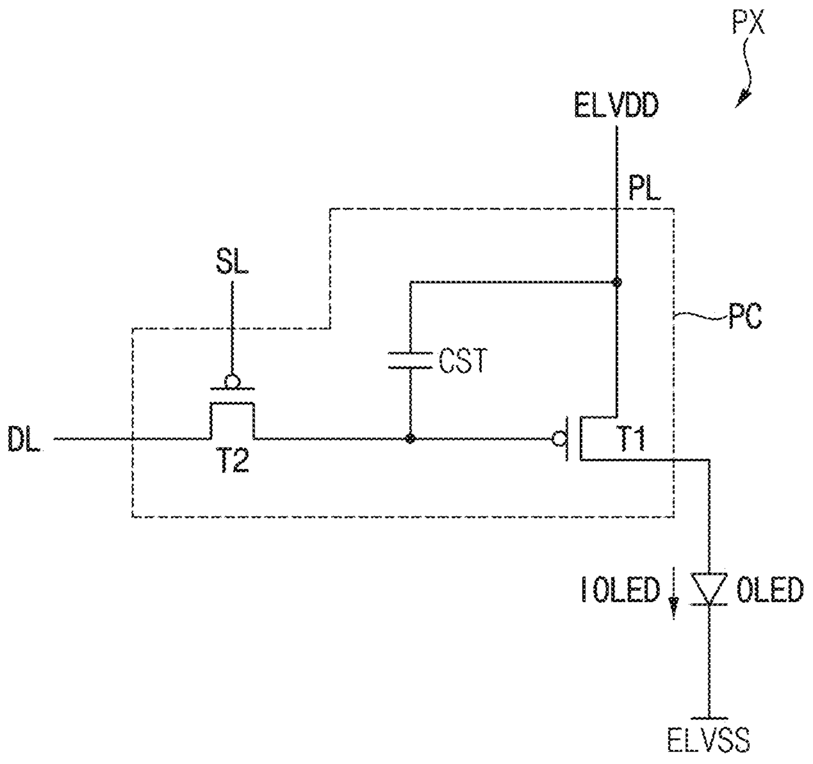
FIG. 2 is an equivalent circuit diagram of the pixel of FIG. 1 according to an embodiment.

FIG. 2 is an equivalent circuit diagram of the pixel of FIG. 1 according to an embodiment.

Referring to FIG. 2, the pixel PX may include a light emitting element such as an organic light-emitting diode OLED. The light emitting element may be connected to a pixel circuit PC, and the pixel circuit PC may include a thin film transistor, a capacitor, or the like.

In an embodiment, the pixel circuit PC may include a first transistor T1, a second transistor T2, and a capacitor Cst. Each of the pixels PX may emit, for example, red, green, blue, or white light through the organic light emitting diode OLED. The first transistor T1 and the second transistor T2 may be implemented as thin film transistors.

The second transistor T2 may be a switching transistor, connected to the scan line SL and the data line DL, and transmit the data signal input from the data line DL to the first transistor T1 in response to the scan signal input from the scan line SL.

The capacitor Cst may be connected to the second transistor T2 and a driving voltage line PL, and store a voltage corresponding to a difference between a voltage corresponding to the data signal received from the second transistor T2 and a driving voltage (the first power voltage) ELVDD supplied to the driving voltage line PL.

The first transistor T1 may be a driving transistor, which is connected to the driving voltage line PL and the capacitor Cst, and control a driving current Ioled flowing through the organic light emitting diode OLED from the driving voltage line PL in response to a voltage value stored in the capacitor Cst.

The organic light emitting diode OLED may emit light with a certain brightness by the driving current Ioled. The opposite electrode of the organic light emitting diode OLED may be supplied with a common voltage (the second power voltage) ELVSS.

FIG. 2 illustrates that the pixel circuit PC includes two transistors and one capacitor, but the present invention is not limited thereto. The number of transistors and capacitors may be changed variously according to a design (or an embodiment) of the pixel circuit PC.

Figure 3:
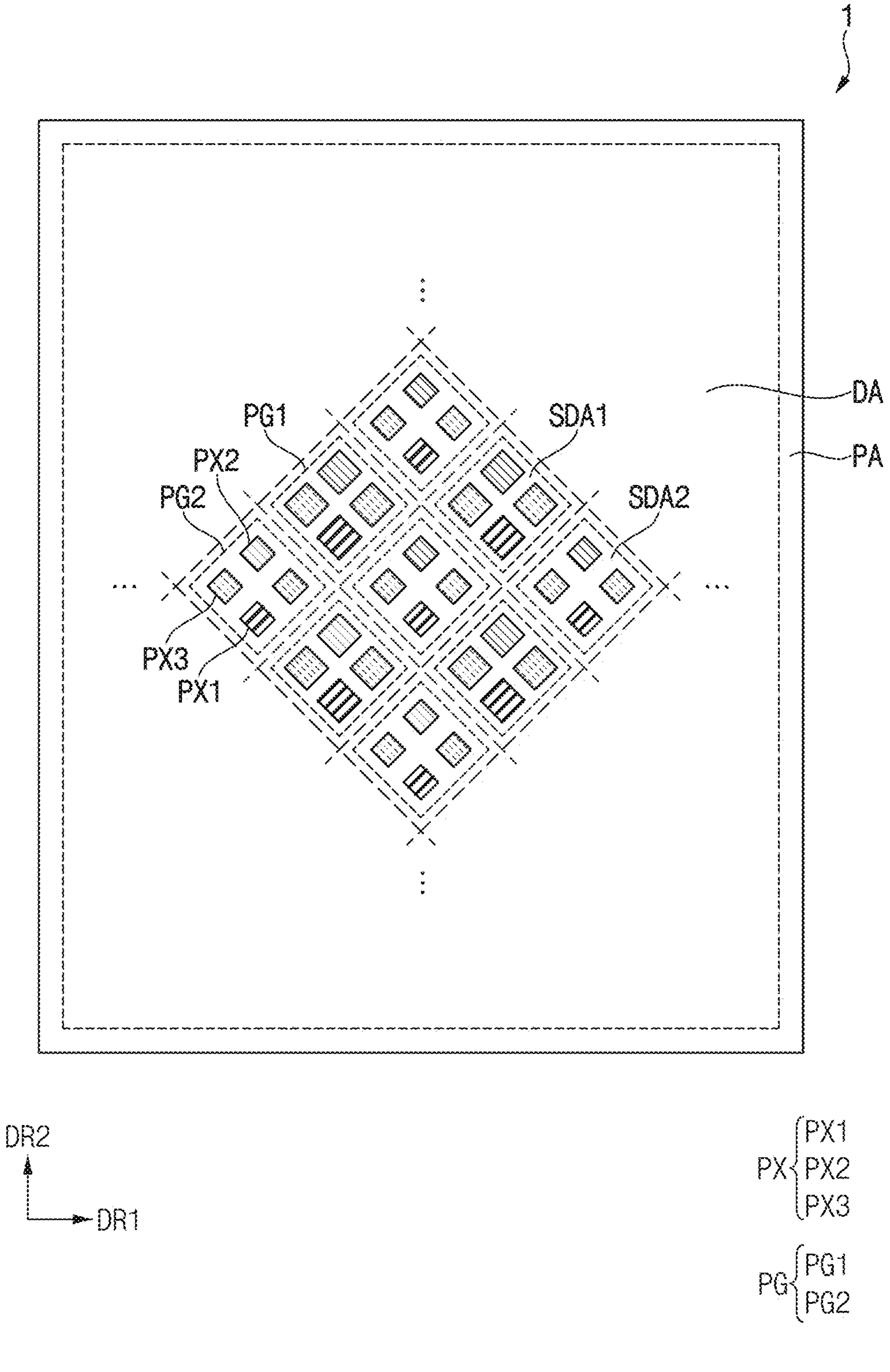
FIG. 3 is a plan view schematically illustrating a display device according to an embodiment.
Figure 4:
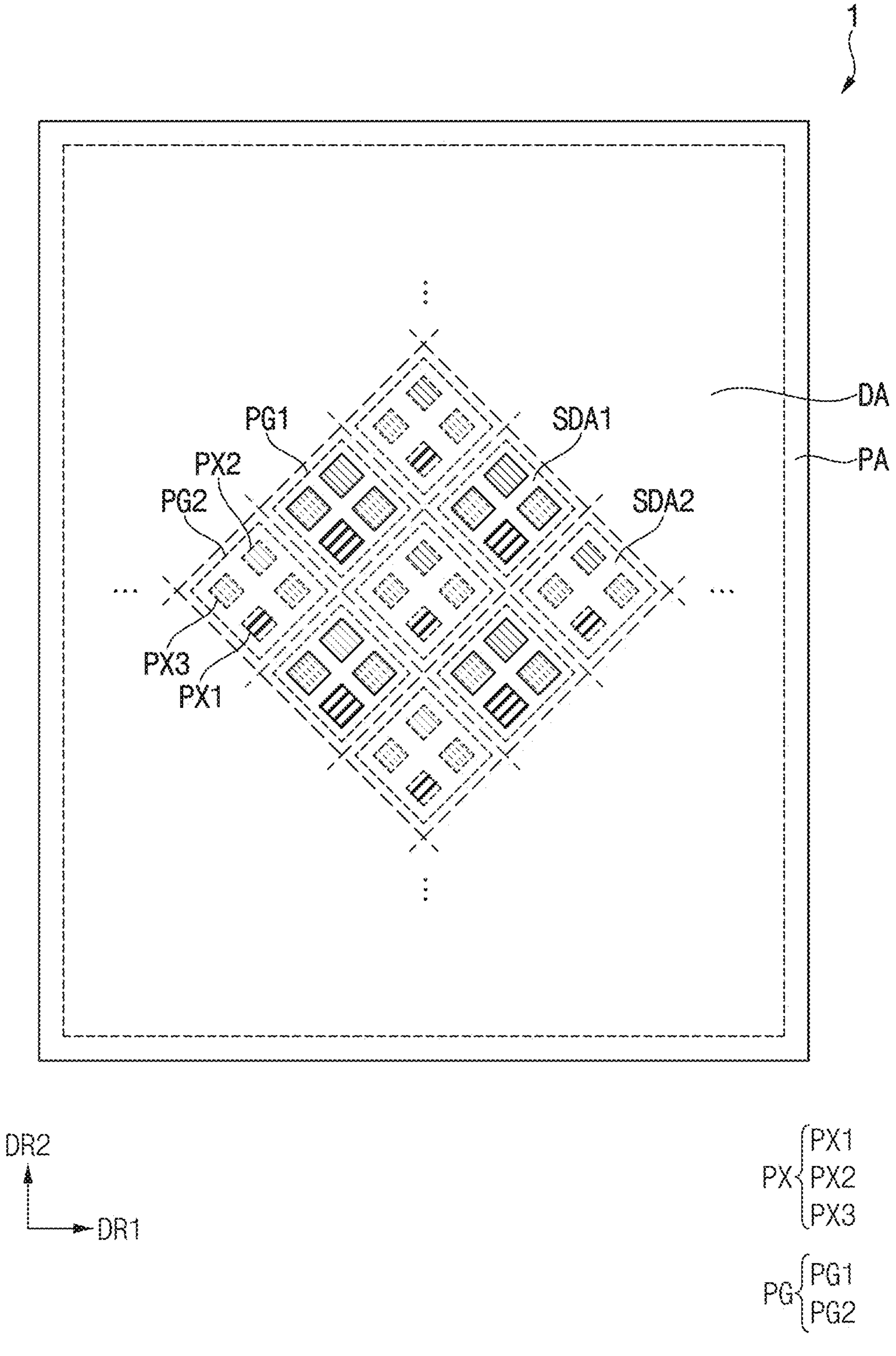
FIG. 4 is a diagram illustrating a driving of the display device of FIG. 3.

FIG. 3 is a plan view schematically illustrating a display device according to an embodiment. FIG. 4 is a diagram illustrating a driving of the display device of FIG. 3. As used herein, the "plan view" is a view in a thickness direction (e.g., third direction DR3) of a substrate of the display device. The third direction DR3 is perpendicular to the first and second directions DR1 and DR2.

Referring to FIGS. 3 and 4, the display device 1 may be divided into a display area DA and a peripheral area PA outside the display area DA. The display area DA may display an image. The peripheral area PA may be a type of non-display area that does not display images. The display area DA may be entirely surrounded by the peripheral area PA. Various components constituting the display device 1 may be disposed on a substrate (SUB, see FIG. 8). Accordingly, the substrate SUB may be viewed as including the display area DA and the peripheral area PA.

The Pixels PX may be arranged in the display area DA. The pixels PX include a plurality of first pixels PX1 for displaying a first color, a plurality of second pixels PX2 for displaying a second color, and a plurality of third pixels PX3 for displaying a third color. In an embodiment, the first pixel PX1 may display red color, the second pixel PX2 may display blue color, and the third pixel PX3 may display green color.

In the display area DA, pixel groups PG, in which a predetermined number of pixels are grouped, may be repeatedly arranged in the first direction DR1 and the second direction DR2. In an embodiment, for example, each of the pixel groups PG may include two second pixels PX2, one first pixel PX1, and one third pixel PX3. The pixel groups PG may include a first pixel group PG1 and a second pixel group PG2. In the display area DA, the first pixel group PG1 and the second pixel group PG2 may be alternately arranged in the first direction DR2 and the second direction DR2. Accordingly, the display area DA may have a structure in which a first sub-display area SDA1 in which the first pixel group PG1 is arranged and a second sub-display area SDA2 in which the second pixel group PG2 are repeatedly arranged in the first direction DR1 and the second direction DR2. In this specification, the first sub-display area SDA1 may be referred to as a "first area", and the second sub-display area SDA2 may be referred to as a "second area".

The first pixel group PG1 and the second pixel group PG2 may have a rectangular shape consisting of two second pixels PX2, one first pixel PX1, and one third pixel PX3. The first pixel group PG1 and the second pixel group PG2 may be merely divisions of repetitive shapes and do not indicate a disconnection of a component.

A size (planar area) of the first sub-display area SDA1 and the size (planar area) of the second sub-display area SDA2 may be same or different. FIG. 3 illustrates a case in which the size (planar area) of the first sub-display area SDA1 and the size (planar area) of the second sub-display area SDA2 are same. As used herein, the "planar area" of an object (e.g., certain region, opening, etc.) is defined as an area of the object in a plan view.

In an embodiment, an arrangement of the first pixel PX1, the second pixel PX2, and the third pixel PX3 constituting the first pixel group PG1 may be similar to an arrangement of the first pixel PX1, the second pixel PX2, and the third pixel PX3 constituting the second pixel group PG2.

A size (planar area) of each of the first pixel PX1, the second pixel PX2, and the third pixel PX3 in the first pixel group PG1 may be larger than a size (planar area) of each of the first pixel PX1, second pixel PX2, and third pixel PX3 corresponding in the second pixel group PG2. That is, the size (planar area) of each pixel electrode of the first pixel PX1, the second pixel PX2, and the third pixel PX3 in the first pixel group PG1 may be larger than the size (planar area) of each pixel electrode of the first pixel PX1, the second pixel PX2, and the third pixel PX3 corresponding in the second pixel group PG2. In an embodiment, for example, a size (planar area) of a pixel electrode of the first pixel PX1 in the first pixel group PG1 may be larger than a size (planar area) of a pixel electrode of the first pixel PX1 in the second pixel group PG2.

A driving circuit for driving the pixels PX, for example, the scan driver 130, the data driver 150, and the controller 170 illustrated in FIG. 1, may be disposed in the peripheral area PA.

In an embodiment, the display device 1 may operate in a normal driving mode (first mode) or a private driving mode (second mode). The normal driving mode may be a mode that provides a wide viewing angle in all directions. The private drive mode may be a mode that provides a narrow viewing angle in at least some directions, and may be a mode in which a side view is narrowed or blocked compared to the normal driving mode. While the display device 1 operates in the private driving mode, a viewing angle of others looking at the display device 1 from a side may be narrowed or blocked. Therefore, exposure of personal information may be prevented or reduced.

The controller 170 (see FIG. 1) may receive a selection signal of the normal driving mode or the private driving mode. Accordingly, the controller 170 may output a control signal to the scan driver 130 (see FIG. 1) and the data driver 150 (see FIG. 1) so that the display device 1 operates in the normal driving mode or the private driving mode according to the selection signal.

In the normal driving mode, the first to third pixels PX1, PX2, and PX3 constituting the first pixel group PG1 and the second pixel group PG2 of the display area DA may be all selected by the scan signal and emit light with a luminance corresponding to the data signal.

As illustrated in FIG. 4, in the private driving mode, the first to third pixels PX1, PX2, and PX3 constituting the second pixel group PG2 of the display area DA may not emit light, and the first to third pixels PX1, PX2, and PX3 constituting the first pixel group PG1 may emit light with a luminance corresponding to the data signal. Here, non-emission of a pixel may include a case where the pixel is not selected by the scan signal and therefore does not receive the data signal, and/or a case where the pixel is selected by the scan signal but receives a black data signal and expresses black.

Figure 5:
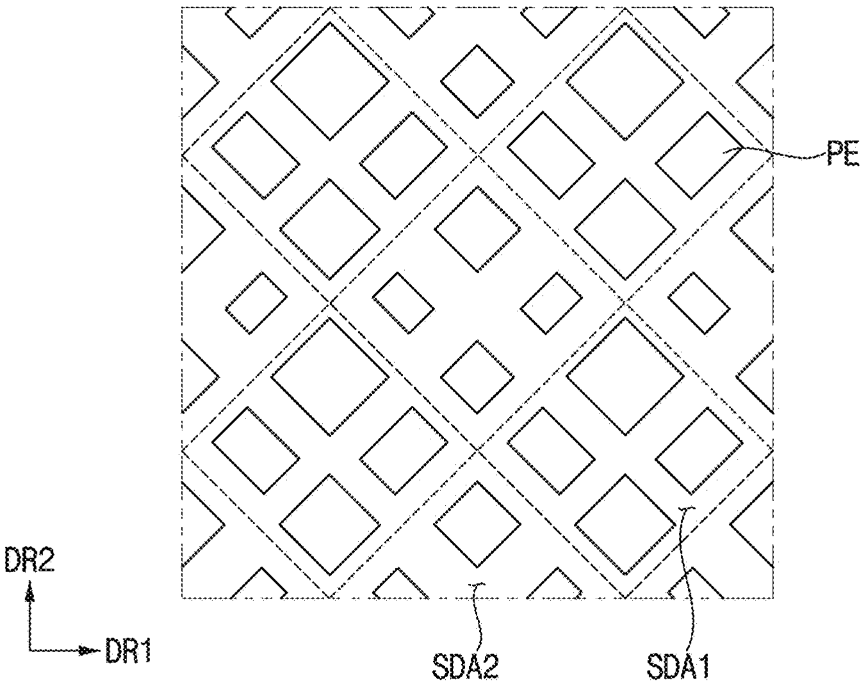
FIGS. 5 to 7 are plan views schematically illustrating a portion of the display area of the display device of FIG. 3.
Figure 6:
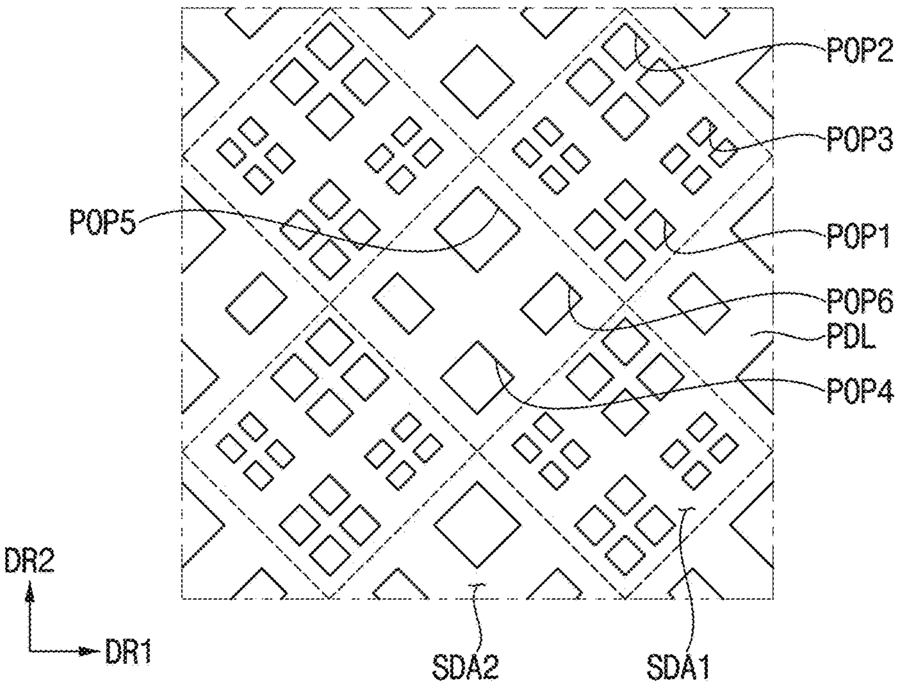
Figure 7:
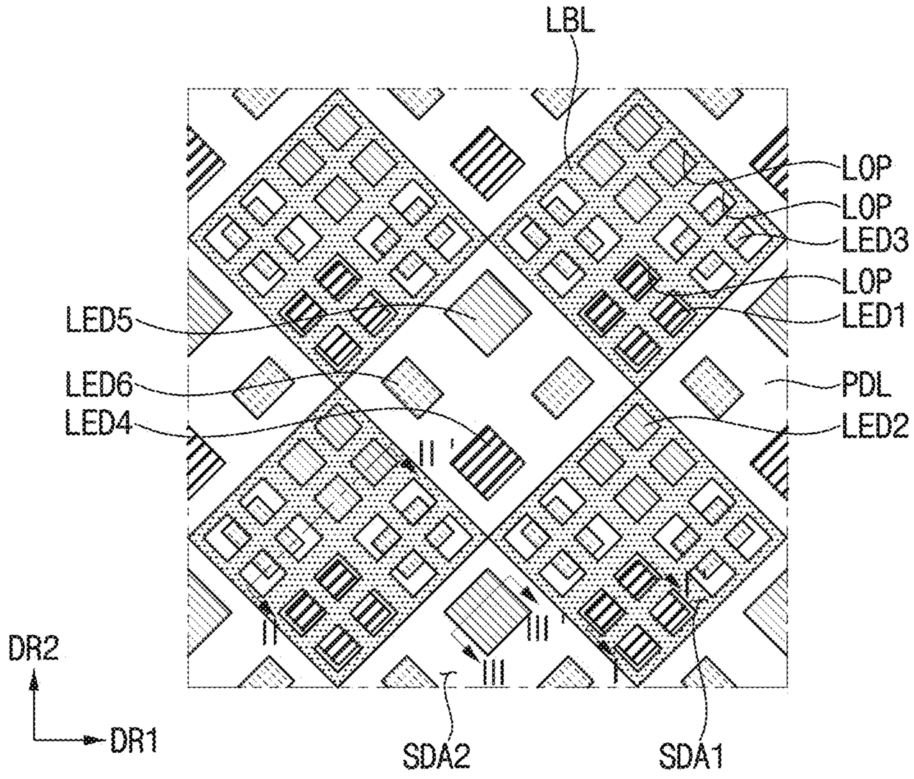

FIGS. 5 to 7 are plan views schematically illustrating a portion of the display area of the display device of FIG. 3.

In an embodiment, for example, FIG. 5 is a plan view schematically illustrating an arrangement of a pixel electrode of the display device of FIG. 3, FIG. 6 is a plan view schematically illustrating an arrangement of a pixel defining layer of the display device of FIG. 3, and FIG. 7 is a plan view schematically illustrating an arrangement of a light emitting element and a light blocking layer of the display device of FIG. 3.

Figure 8:
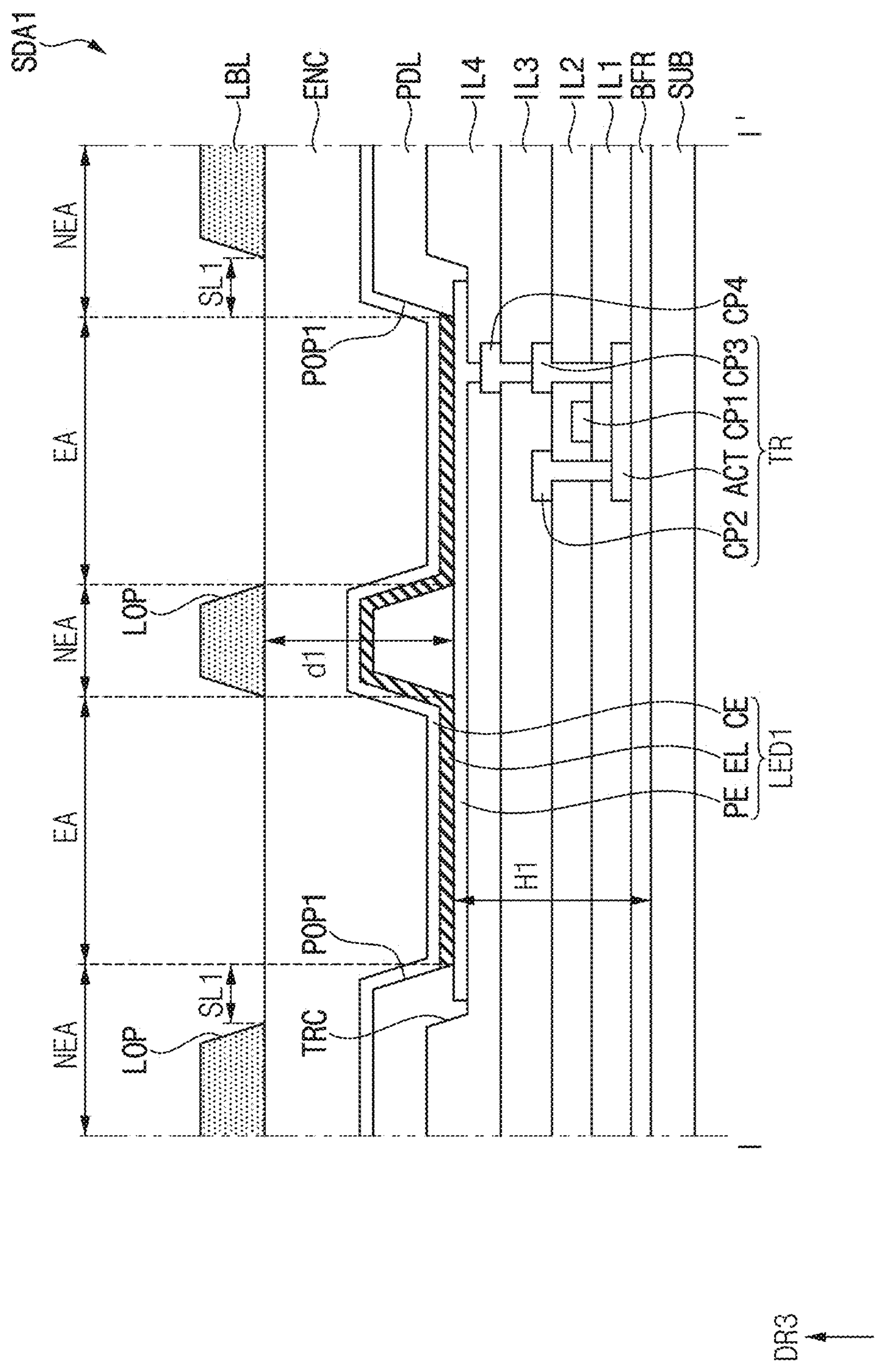
FIG. 8 is a cross-sectional view taken along line I-I' of FIG. 7 according to an embodiment.
Figure 9:
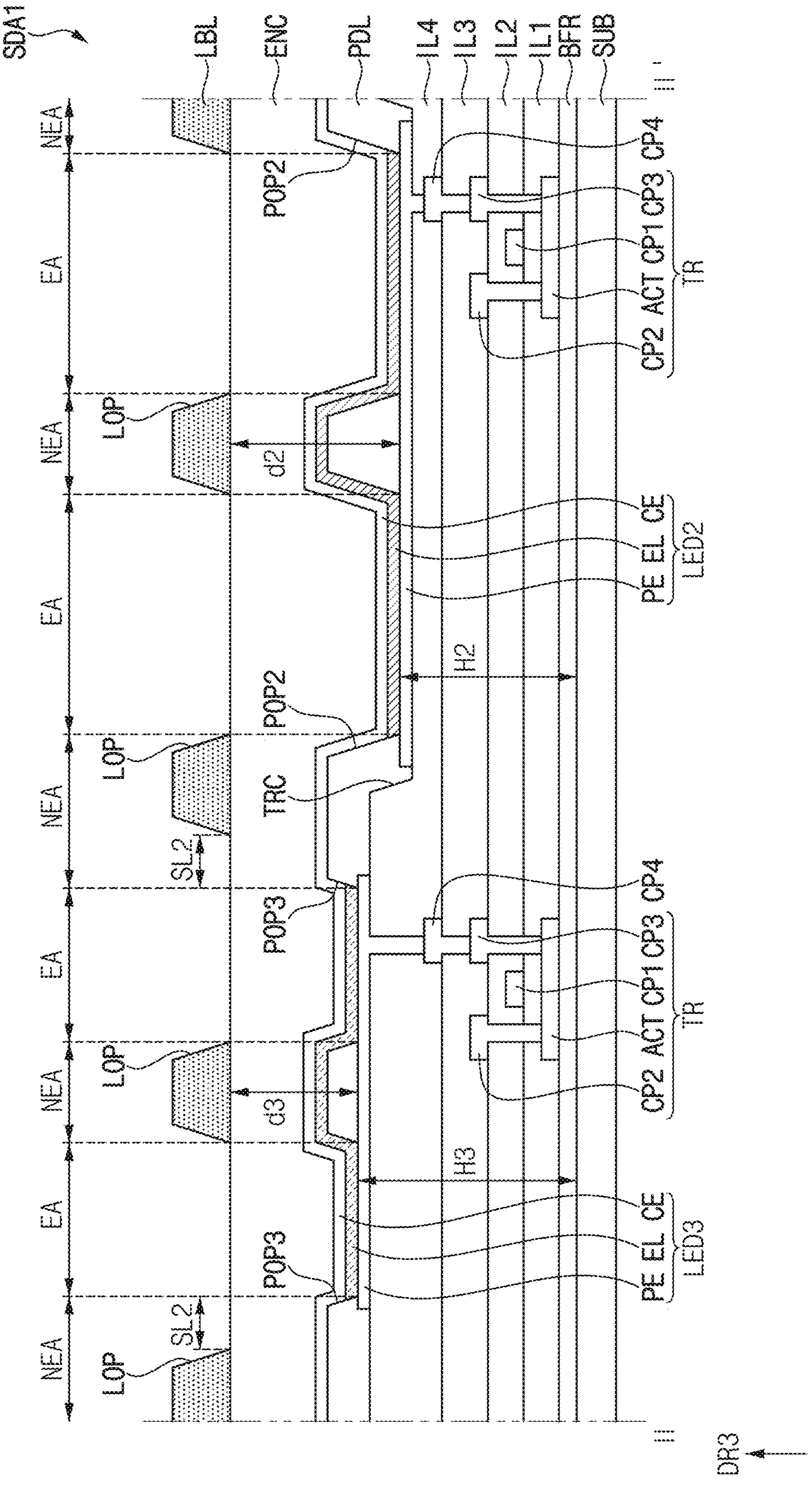
FIG. 9 is a cross-sectional view taken along line II-II' of FIG. 7 according to an embodiment.
Figure 10:
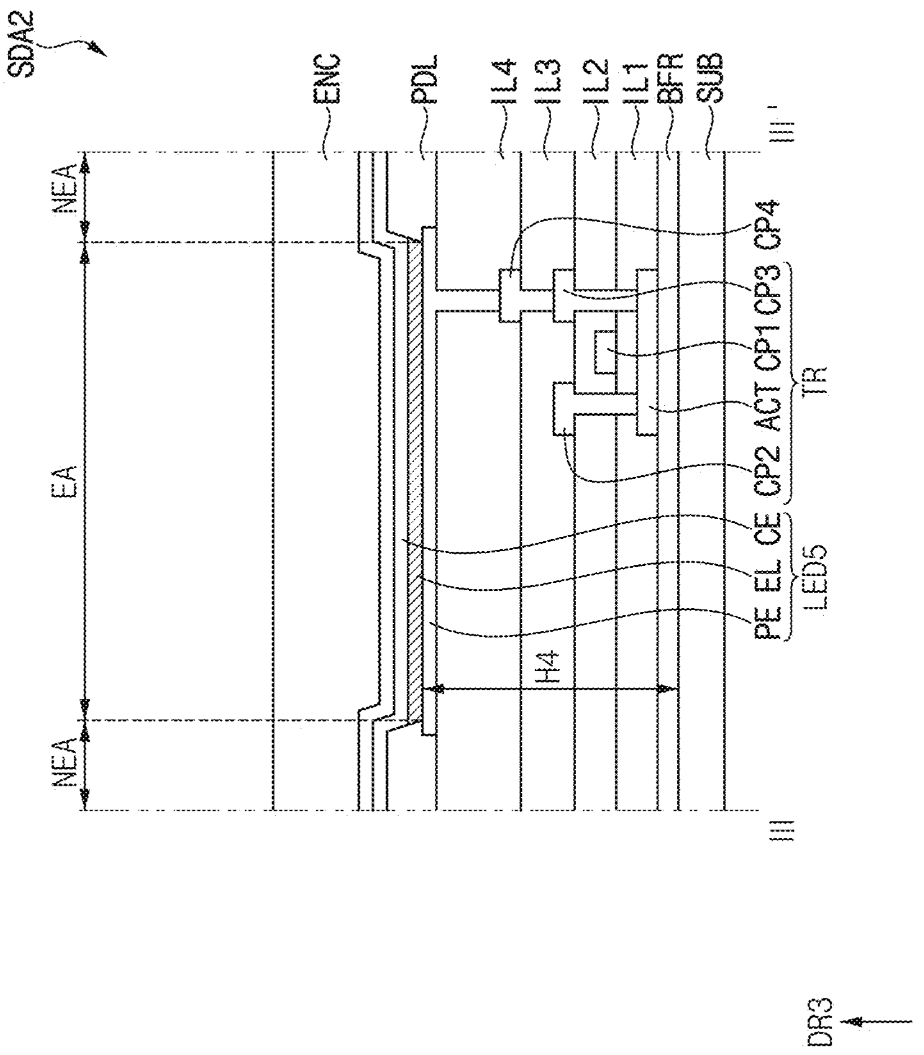
FIG. 10 is a cross-sectional view taken along line III-III' of FIG. 7 according to an embodiment.

FIG. 8 is a cross-sectional view taken along line I-I' of FIG. 7 according to an embodiment. FIG. 9 is a cross-sectional view taken along line II-II' of FIG. 7 according to an embodiment. FIG. 10 is a cross-sectional view taken along line III-III' of FIG. 7 according to an embodiment.

In an embodiment, for example, FIG. 8 illustrates an emission area EA of the first sub-display area SDA1 corresponding to a first light emitting element LED1 of FIG. 7, FIG. 9 illustrates an emission area EA of the first sub-display area SDA1 corresponding to a second light emitting device LED2 and a third light emitting device LED3 of FIG. 7, and FIG. 10 illustrates an emission area EA of the second sub display area SDA2 corresponding to a fifth light emitting element LED5 of FIG. 7. A cross-sectional structure of the fourth light emitting element LED4 and a sixth light emitting element LED6 of FIG. 7 may be substantially same as ta cross-sectional structure of the fifth light emitting element LED5 illustrated in FIG. 10.

First, referring to FIGS. 7 to 10, the display device 1 may include a substrate SUB, a buffer layer BFR, first to fourth insulating layers IL1, IL2, IL3, and IL4, an active pattern ACT, first to fourth conductive patterns CP1, CP2, CP3, and CP4, the first to sixth light emitting elements LED1, LED2, LED3, LED4, LED5, and LED6, a pixel defining layer PDL, an encapsulation layer ENC, and a light blocking layer LBL. The active pattern ACT and the first to third conductive patterns CP1, CP2, and CP3 may form a transistor TR. Each of the first to sixth light emitting elements LED1, LED2, LED3, LED4, LED5, and LED6 may include a pixel electrode PE, a light emitting layer EL, and a common electrode CE.

The substrate SUB may include a transparent or opaque material. In an embodiment, examples of materials that can be used as the substrate SUB may include glass, quartz, plastic, or the like. These may be used alone or in combination with each other.

The buffer layer BFR may be disposed on the substrate SUB. The buffer layer BFR may prevent impurities such as oxygen and moisture from diffusing into an upper portion of the substrate SUB. The buffer layer BFR may include an inorganic insulating material such as a silicon compound or metal oxide.

The active pattern ACT may be disposed on the buffer layer BFR. In an embodiment, the active pattern ACT may include a silicon semiconductor material or an oxide semiconductor material.

In an embodiment, the first insulating layer IL1 may be disposed on the buffer layer BFR. The first insulating layer IL1 may cover the active pattern ACT. In an embodiment, the first insulating layer IL1 may be arranged in a pattern form on the active pattern ACT to expose a portion of the active pattern ACT. In an embodiment, for example, the first insulating layer IL1 may be arranged in a pattern form on the active pattern ACT so as to overlap the first conductive pattern CP1 in a plan view. The first insulating layer IL1 may include an inorganic insulating material.

The first conductive pattern CP1 may be disposed on the first insulating layer IL1. In an embodiment, the first conductive pattern CP1 may include metal, alloy, conductive metal oxide, transparent conductive material, or the like.

The second insulating layer IL2 may be disposed on the first insulating layer IL1. In an embodiment, the second insulating layer IL2 may cover the first conductive pattern CP1. The second insulating layer IL2 may include an inorganic insulating material.

The second conductive pattern CP2 and the third conductive pattern CP3 may be disposed on the second insulating layer IL2. The second conductive pattern CP2 and the third conductive pattern CP3 may be electrically connected to the active pattern ACT through contact holes defined in the second insulating layer IL2. Each of the second conductive pattern CP2 and the third conductive pattern CP3 may include a metal, an alloy, a conductive metal oxide, a transparent conductive material, or the like.

The third insulating layer IL3 may be disposed on the second insulating layer IL2. The third insulating layer IL3 may cover the second conductive pattern CP2 and the third conductive pattern CP3. The third insulating layer IL3 may include an organic insulating material.

The fourth conductive pattern CP4 may be disposed on the third insulating layer IL3. The fourth conductive pattern CP4 may be electrically connected to the second conductive pattern CP2 or the third conductive pattern CP3 through a contact hole defined in the third insulating layer IL3. The fourth conductive pattern CP4 may include metal, alloy, conductive metal oxide, transparent conductive material, or the like.

The fourth insulating layer IL4 may be disposed on the third insulating layer IL3. The fourth insulating layer IL4 may cover the fourth conductive pattern CP4. The fourth insulating layer IL4 may include an organic insulating material.

In an embodiment, the fourth insulating layer IL4 may define at least one trench TRC located in the first sub-display area SDA1. The trench TRC may be defined as a portion in which the fourth insulating layer IL4 is depressed to a specific point. That is, the trench TRC may not expose components under the fourth insulating layer IL4. In an embodiment, for example, after applying a preliminary insulating layer on the third insulating layer IL3 and the fourth conductive pattern CP4, the preliminary insulating layer may be patterned using a halftone mask or the like to form the fourth insulating layer IL4 having the trench TRC. As the fourth insulating layer IL4 has the trench TRC, an upper surface of the fourth insulating layer IL4 may have a step in the first sub-display area SDA1. That is, the fourth insulating layer IL4 may have a first portion and a second portion having different thicknesses due to the trench TRC.

A configuration, an arrangement, and a connection structure of the transistor TR and the plurality of insulating layers IL1, IL2, IL3, and IL4 illustrated in FIGS. 8 to 10 are only an example, and may be changed in various ways.

The pixel electrode PE may be disposed on the fourth insulating layer IL4. The pixel electrode PE may contact the fourth conductive pattern CP4 through a contact hole defined in the fourth insulating layer IL4. Accordingly, the pixel electrode PE may be electrically connected to the transistor TR. In an embodiment, the pixel electrode PE may include metal, alloy, conductive metal oxide, transparent conductive material, or the like.

Referring further to FIG. 5, the pixel electrode PE may be disposed in the first sub-display area SDA1 and the second sub-display area SDA2 on the fourth insulating layer IL4. The pixel electrode PE may be disposed in each pixel. Pixel electrodes corresponding to each of neighboring pixels may be arranged to be spaced apart from each other.

As illustrated in FIGS. 8 and 9, in the first sub-display area SDA1, the pixel electrode PE of the first light emitting element LED1 and the pixel electrode PE of the second light emitting element LED2 may be disposed in the trench TRC of the fourth insulating layer IL4. On the other hand, the pixel electrode PE of the third light emitting element LED3 may not be disposed in the trench TRC.

Accordingly, the pixel electrode PE of the third light emitting element LED3 may be disposed at a level different from at least one of the pixel electrode PE of the first light emitting element LED1 and the pixel electrode PE of the second light emitting element LED2.

In an embodiment, for example, the pixel electrode PE of the third light emitting element LED3 may disposed at a level different from the pixel electrode PE of the first light emitting element LED1 and the pixel electrode PE of the second light emitting element LED2, and the pixel electrode PE of the first light emitting element LED1 and the pixel electrode PE of the second light emitting element LED2 may be disposed at the same level.

In other words, an upper surface of the pixel electrode PE of the first light emitting element LED1 may have a first height H1 from an upper surface of the substrate SUB, an upper surface of the pixel electrode PE of the second light emitting element LED2 may have a second height H2 equal to the first height H1 from the upper surface of the substrate SUB, and an upper surface of the pixel electrode PE of the third light emitting element LED3 may have a third height H3 different from the first height H1 and the second height H2 from the upper surface of the substrate SUB.

In an embodiment, for example, in the first sub-display area SDA1, the pixel electrode PE of the third light emitting element LED3 may be disposed at a level higher than a level at which the pixel electrode PE of the first light emitting element LED1 and the pixel electrode PE of the second light emitting element LED2 are disposed. In other words, the upper surface of the pixel electrode PE of the third light emitting element LED3 may have the third height H3 higher than the first height H1 and the second height H2 from the upper surface of the substrate SUB.

However, the present invention is not necessarily limited thereto, in an embodiment, if the pixel electrode PE of the third light emitting element LED3 disposes at a level different from at least one of the pixel electrode PE of the first light emitting element LED1 and the pixel electrode PE of the second light emitting element LED2, the pixel electrode PE of the first light emitting element LED1 and the pixel electrode PE of the second light emitting element LED2 may be disposed at different levels from each other.

That is, in an embodiment, if the upper surface of the pixel electrode PE of the third light emitting element LED3 has the third height H3 which is different from the first height H1 and the second height H2 from the upper surface of the substrate SUB, the first height H1 and the second height H2 may be different from each other.

As illustrated in FIG. 10, in the second sub-display area SDA2, the pixel electrode PE of the fifth light emitting element LED5 may not be disposed in the trench TRC. Although not shown, the pixel electrode PE of the fourth light emitting element LED4 and the pixel electrode PE of the sixth light emitting element LED6 may also not be disposed in the trench TRC. That is, since the trench TRC is not defined in the second sub-display area SDA2, the pixel electrode PE may not be disposed in the trench TRC in the second sub-display area SDA2.

Accordingly, the pixel electrode PE of the fifth light emitting element LED5 may be disposed at the same level as the pixel electrode PE of the third light emitting element LED3. In other words, an upper surface of the pixel electrode PE of the fifth light emitting element LED5 may have a fourth height H4 equal to the third height H3 from the upper surface of the substrate SUB.

Although not illustrated, the pixel electrode PE of the fourth light emitting element LED4 and the pixel electrode PE of the sixth light emitting element LED6 may be also disposed at the same level as the pixel electrode PE of the third light emitting element LED3. That is, an upper surface of the pixel electrode PE of the fourth light emitting element LED4 may have the fourth height H4 equal to the third height H3 from the upper surface of the substrate SUB, and an upper surface of the pixel electrode PE of the sixth light emitting element LED6 may have the fourth height H4 equal to the third height H3 from the upper surface of the substrate SUB.

The pixel defining layer PDL may be disposed on the fourth insulating layer IL4 and the pixel electrode PE. The pixel defining layer PDL may include an organic insulating material. In an embodiment, the pixel defining layer PDL may further include a light blocking material. Examples of the light blocking material of the pixel defining layer PDL may include black pigment, black dye, or the like.

Referring further to FIG. 6, the pixel defining layer PDL may expose a portion of the pixel electrode PE of each of the first to third light emitting elements LED1, LED2, and LED3 in the first sub-display area SDA1.

Specifically, the pixel defining layer PDL may have a first pixel opening POP1 that exposes a portion of the pixel electrode PE of the first light emitting element LED1, a second pixel opening POP2 that exposes a portion of the second pixel electrode PE of the second light emitting element LED2, and a third pixel opening POP3 that exposes a portion of the pixel electrode PE of the third light emitting element LED3. In an embodiment, for example, the first to third pixel openings POP1, POP2, and POP3 may expose a plurality of portions of the pixel electrode PE which is corresponding.

In an embodiment, a size (planar area) of the third pixel opening POP3 may be smaller than each of a size (planar area) of the first pixel opening POP1 and a size (planar area) of the second pixel opening POP2. The size (planar area) of the first pixel opening POP1 may be smaller than the size (planar area) of the second pixel opening POP2.

The pixel defining layer PDL may cover edges of the pixel electrode PE of the fourth to sixth light emitting elements LED4, LED5, and LED6 in the second sub-display area SDA2, and expose a plurality of portions of the pixel electrode PE which is corresponding.

Specifically, the pixel defining layer PDL may have a fourth pixel opening POP4 that exposes a portion of the pixel electrode PE of the fourth light emitting element LED4, a fifth pixel opening POP5 which exposes a portion of the pixel electrode PE of the fifth light emitting element LED5, and a sixth pixel opening POP6 that exposes a portion of the pixel electrode PE of the sixth light emitting element LED6.

In an embodiment, a size (planar area) of the sixth pixel opening POP6 may be smaller than each of a size (planar area) of the fourth pixel opening POP4 and a size (planar area) of the fifth pixel opening POP5. The size (planar area) of the fourth pixel opening POP4 may be smaller than the size (planar area) of the fifth pixel opening POP5.

The emission area EA may be defined by the pixel openings POP1, POP2, POP3, POP4, POP5, and POP6 of the pixel defining layer PDL. That is, the pixel defining layer PDL may be disposed in the non-emission area NEA surrounding the emission area EA. The non-emission area NEA may be defined by the pixel defining layer PDL as shown in FIGS. 8 to 16.

In an embodiment, a portion of the pixel defining layer PDL may be disposed in the trench TRC. In an embodiment, for example, as shown in FIGS. 8 and 9, a portion of the pixel defining layer PDL may cover an edge of the trench TRC.

The light emitting layer EL may be disposed in the pixel openings POP1, POP2, POP3, POP4, POP5, and POP6 of the pixel defining layer PDL. As shown in FIGS. 8 and 9, in the first sub-display area SDA1, the light emitting layer EL may be disposed on the pixel defining layer PDL which divides one pixel electrode into a plurality of parts.

In an embodiment, the light emitting layer EL may include a material that emits light. In an embodiment, for example, the light emitting layer EL may include an organic light emitting material. In an embodiment, the light emitting layer EL of the first light emitting element LED1 and the light emitting layer EL of the fourth light emitting element LED4 may include a material capable of emitting red light, the light emitting layer EL of the second light emitting element LED2 and the light emitting layer EL of the fifth light emitting element LED5 may include a material capable of emitting blue light, and the light emitting layer EL of the third light emitting element LED3 and the light emitting layer EL of the sixth light emitting element LED6 may include a material capable of emitting green light. However, the present invention is not necessarily limited thereto.

Functional layers such as a hole injection layer, a hole transport layer, an electron transport layer, and an electron injection layer may be additionally disposed above and/or below of the light emitting layer EL.

The common electrode CE may be disposed on the light emitting layer EL. The common electrode CE may include a conductive material such as a metal, alloy, conductive metal nitride, conductive metal oxide, transparent conductive material, or the like. In an embodiment, the common electrode CE may extend continuously across a plurality of pixels.

The pixel electrode PE, the light emitting layer EL, and the common electrode CE may form the first to sixth light emitting elements LED1, LED2, LED3, LED4, LED5, and LED6. The first to third light emitting elements LED1, LED2, and LED3 may be disposed in the first sub-display area SDA1 and provide light of different colors to the emission area EA of the first sub-display area SDA1. The fourth to sixth light emitting elements LED4, LED5, and LED6 may be disposed in the second sub-display area SDA2 and provide light of different colors to the emission area EA of the second sub-display area SDA2.

In an embodiment, for example, the first light emitting element LED1 and the fourth light emitting element LED4 may provide red light to the emission area EA, the second light emitting element LED2 and the fifth light emitting element LED5 may provide blue light to the emission area EA, and the third light emitting element LED3 and the sixth light emitting element LED6 may provide green light to the emission area EA. However, the present invention is not necessarily limited thereto.

The encapsulation layer ENC may be disposed on the first to sixth light emitting elements LED1, LED2, LED3, LED4, LED5, and LED6. The encapsulation layer ENC may protect the first to sixth light emitting elements LED1, LED2, LED3, LED4, LED5, and LED6 from external moisture, heat, shock, or the like. Although not shown, the encapsulation layer ENC may include a first inorganic encapsulation layer, an organic encapsulation layer disposed on the first inorganic encapsulation layer, and a second inorganic encapsulation layer disposed on the organic encapsulation layer.

The light blocking layer LBL may be disposed on the encapsulation layer ENC. As illustrated in FIG. 7, the light blocking layer LBL may not be disposed in the second sub-display area SDA2 but only in the first sub-display area SDA1. The light blocking layer LBL may define an emission opening LOP corresponding to the emission area EA of the first sub-display area SDA1. The emission opening LOP of the light blocking layer LBL may overlap the first to third pixel openings POP1, POP2, and POP3 of the pixel defining layer PDL in a plan view.

As illustrated in FIGS. 7 to 9, a size (planar area) of the emission opening LOP of the light blocking layer LBL may be larger than the size (planar area) of the first pixel opening POP1 and the size (planar area) of the third pixel opening POP3. Additionally, the size (planar area) of the emission opening LOP of the light blocking layer LBL may be substantially same as the size (planar area) of the second pixel opening POP2.

In an embodiment, for example, as illustrated in FIG. 8, an edge of the emission opening LOP corresponding to the first pixel opening POP1 and an edge of the first pixel opening POP1 may be spaced apart by a first separation distance SL1. Additionally, as illustrated in FIG. 9, an edge of the emission opening LOP corresponding to the third pixel opening POP3 and an edge of the third pixel opening POP3 may be spaced apart by a second separation distance SL2. Additionally, an edge of the emission opening LOP corresponding to the second pixel opening POP2 may substantially coincide with an edge of the second pixel opening POP2.

In the first sub-display area SDA1, the light blocking layer LBL may block and/or change a path of light traveling in a direction other than the third direction DR3 among light emitted from the light emitting elements disposed in the first sub-display area SDA1. Accordingly, the light blocking layer LBL may direct light emitted from the light emitting elements disposed in the first sub-display area SDA1 in the third direction DR3. Accordingly, in the private driving mode, user's field of view may be narrowed or blocked by the azimuth of the display device 1 (for example, when viewed obliquely from left, right, top, or bottom side of the display device 1).

At least one of a first distance d1 from the upper surface of the pixel electrode PE of the first light emitting element LED1 to a lower surface of the light blocking layer LBL and a second distance d2 from the upper surface of the pixel electrode PE of the second light emitting element LED2 to the lower surface of the light blocking layer LBL may be different from a third distance d3 from the upper surface of the pixel electrode PE of the third light emitting element LED3 to the lower surface of the light blocking layer LBL.

In an embodiment, for example, as illustrated in FIGS. 8 and 9, the first distance d1 from the upper surface of the pixel electrode PE of the first light emitting element LED1 to the lower surface of the light blocking layer LBL may be equal to the second distance d2 from the upper surface of the pixel electrode PE of the second light emitting element LED2 to the lower surface of the light blocking layer LBL. In addition, the third distance d3 from the upper surface of the pixel electrode PE of the third light emitting element LED3 to the lower surface of the light blocking layer LBL may be different from the first distance d1 and the second distance d2.

In an embodiment, for example, as the pixel electrode PE of the first light emitting element LED1 and the pixel electrode PE of the second light emitting device LED2 are disposed in the trench TRC of the fourth insulating layer IL4, and the pixel electrode PE of the third light emitting element LED3 is not disposed in the trench TRC, the pixel electrode PE of the third light emitting element LED3 may be disposed at a level higher than the pixel electrode PE of the first light emitting element LED1 and the pixel electrode PE of the second light emitting element LED2. Accordingly, the third distance d3 from the upper surface of the pixel electrode PE of the third light emitting element LED3 to the lower surface of the light blocking layer LBL may be shorter than the first distance d1 from the upper surface of the pixel electrode PE of the first light emitting element LED1 to the lower surface of the light blocking layer LBL and the second distance d2 from the upper surface of the pixel electrode PE of the second light emitting element LED2 to the lower surface of the light blocking layer LBL.

However, the present invention is not necessarily limited thereto, and in an embodiment, if the third distance d3 is different from the first distance d1 and the second distances d2, the first distance d1 and the second distance d2 may be different from each other.

Although not shown, separate functional layers may be further disposed between the encapsulation layer ENC and the light blocking layer LBL. In an embodiment, for example, the functional layer may include a sensing layer that detects a user's touch, or the like. The sensing layer may include at least one touch electrode and at least one touch insulating layer.

According to embodiments, in the first sub-display area SDA1 where the light blocking layer LBL is disposed, the pixel electrode PE of the first light emitting element LED1 and the pixel electrode PE of the second light emitting element LED2, and the pixel electrode PE of the third light emitting element LED3 may not all be disposed at the same level. That is, at least one of the pixel electrode PE of the first light emitting element LED1, the pixel electrode PE of the second light emitting element LED2, and the pixel electrode PE of the third light emitting element LED3 may be disposed at different level from the others.

Accordingly, a distance from the upper surface of the pixel electrode PE of the first light emitting element LED1 to the lower surface of the light blocking layer LBL, a distance from the upper surface of the pixel electrode PE of the second light emitting element LED2 to the lower surface of the light blocking layer LBL, and a distance from the upper surface of the pixel electrode PE of the third light emitting element LED3 to the lower surface of the light blocking layer LBL may not all be the same. That is, at least one of the distance from the upper surface of the pixel electrode PE of the first light emitting element LED1 to the lower surface of the light blocking layer LBL, the distance from the upper surface of the pixel electrode PE of the second light emitting element LED2 to the lower surface of the light blocking layer LBL, and the distance from the upper surface of the pixel electrode PE of the third light emitting element LED3 to the lower surface of the light blocking layer LBL may be different from the others.

Specifically, as considering the size (planar area) of the first pixel opening POP1 exposing a portion of the pixel electrode PE of the first light emitting element LED1, the size (planar area) of the second pixel opening POP2 exposing a portion of the pixel electrode PE of the second light emitting element LED2, and the size (planar area) of the third pixel opening POP3 exposing a portion of the pixel electrode PE of the third light emitting element LED3, a level at which each of the pixel electrode PE of the first light emitting element LED1, the pixel electrode PE of the second light emitting element LED2, and the pixel electrode PE of the third light emitting element LED3 are disposed may be determined.

In an embodiment, for example, when the size (planar area) of the third pixel opening POP3 is smaller than each of the size (planar area) of the first pixel opening POP1 and the size (planar area) of the second pixel opening POP2, a level at which the pixel electrode PE of the third light emitting element LED3 is disposed may be different from at least one of a level at which the pixel electrode PE of the first light emitting element LED1 is disposed and a level at which the pixel electrode PE of the second light emitting element LED2 is disposed.

In other words, a distance from the upper surface of the pixel electrode PE of the third light emitting element LED3 to the lower surface of the light blocking layer LBL may be different from at least one of a distance from the upper surface of the pixel electrode PE of the first light emitting element LED1 to the light blocking layer LBL and a distance from the upper surface of the pixel electrode PE of the second light emitting element LED2 to the lower surface of the light blocking layer LBL.

In an embodiment, for example, the level at which the pixel electrode PE of the third light emitting element LED3 is disposed may be higher than the level at which the pixel electrode PE of the first light emitting element LED1 is disposed and the level at which the pixel electrode PE of the second light emitting element LED2 is disposed.

In other words, the distance from the upper surface of the pixel electrode PE of the third light emitting element LED3 to the lower surface of the light blocking layer LBL may be shorter than the distance from the upper surface of the pixel electrode PE of the first light emitting element LED1 to the light blocking layer LBL and the distance from the upper surface of the pixel electrode PE of the second light emitting element LED2 to the light blocking layer LBL.

In the first sub-display area SDA1 where the light blocking layer LBL is disposed, if the pixel electrode PE of the first light emitting element LED1, the pixel electrode PE of the second light emitting element LED2, and the pixel electrode of the third light emitting element LED3 are all disposed at the same level, the display device in the private driving mode may be affected by difference of sizes (planar areas) between the first to third pixel openings POP1, POP2, and POP3. Therefore, in the private driving mode, luminance deviation for each azimuth of the display device 1 may occur, deteriorating display quality.

According to embodiments, in the first sub-display area SDA1, considering difference of sizes (planar areas) between the first to third pixel openings POP1, POP2, and POP3, difference between levels at which corresponding pixel electrodes PE are disposed may be realized. That is, difference between the distance from the upper surface of the pixel electrode PE of the first light emitting element LED1 to the lower surface of the light blocking layer LBL, the distance from the upper surface of the pixel electrode PE of the second light emitting element LED2 to the lower surface of the light blocking layer LBL, and the distance from the upper surface of the pixel electrode PE of the third light emitting element LED3 to the lower surface of the light blocking layer LBL may be realized. Accordingly, luminance deviation for each azimuth of the display device 1 due to difference of sizes (planar areas) between the first to third pixel openings POP1, POP2, and POP3 may be reduced or prevented. That is, in the private driving mode, the luminance deviation for each azimuth of the display device 1 may be reduced or prevented. Accordingly, the display quality of the display device 1 may be improved. Additionally, a viewing angle may be more easily adjusted in the private driving mode. Therefore, the viewing angle adjustment effect may be improved.

Figure 11:
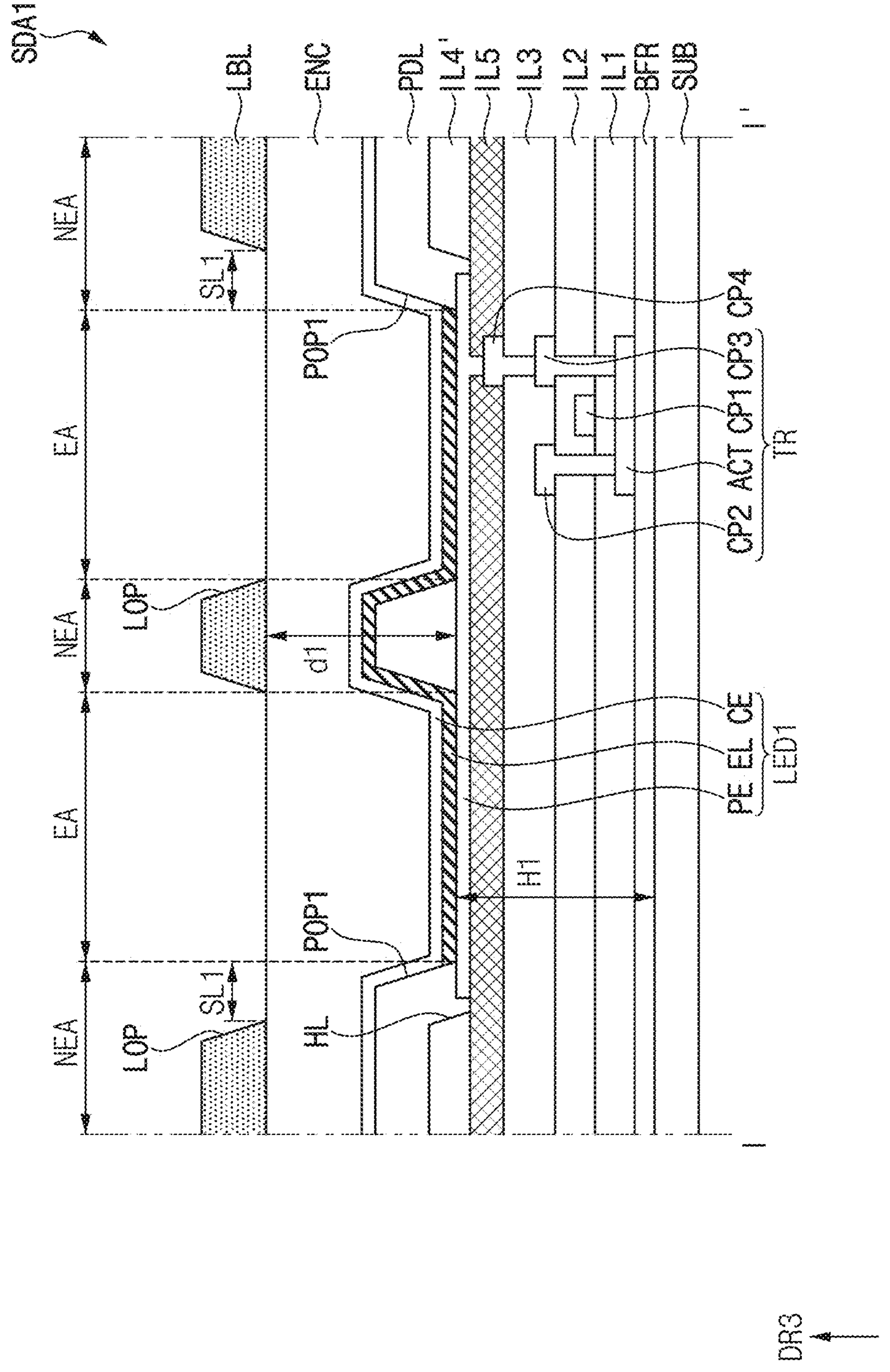
FIG. 11 is a cross-sectional view taken along line I-I' of FIG. 7 according to another embodiment.
Figure 12:
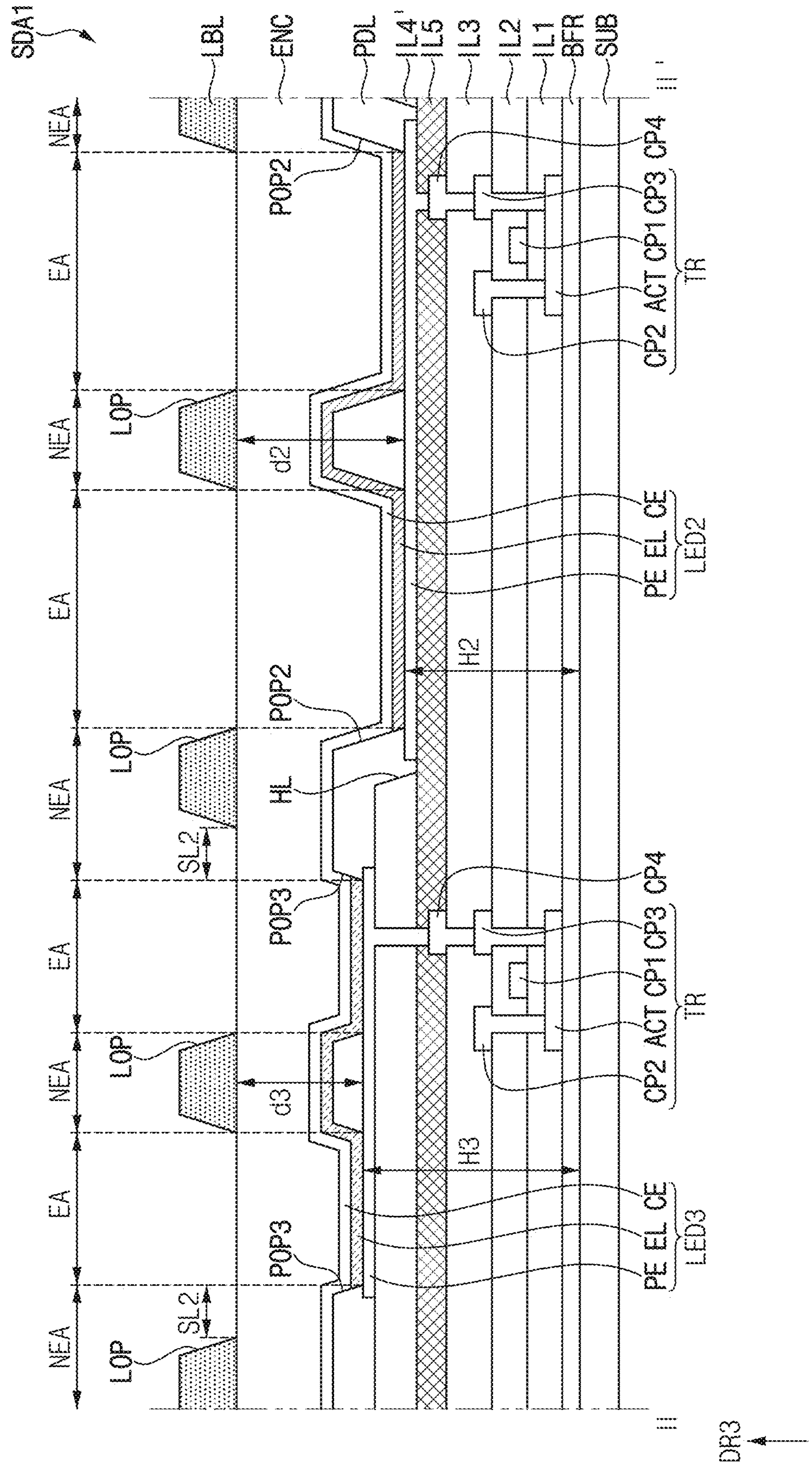
FIG. 12 is a cross-sectional view taken along line II-II' of FIG. 7 according to another embodiment.
Figure 13:
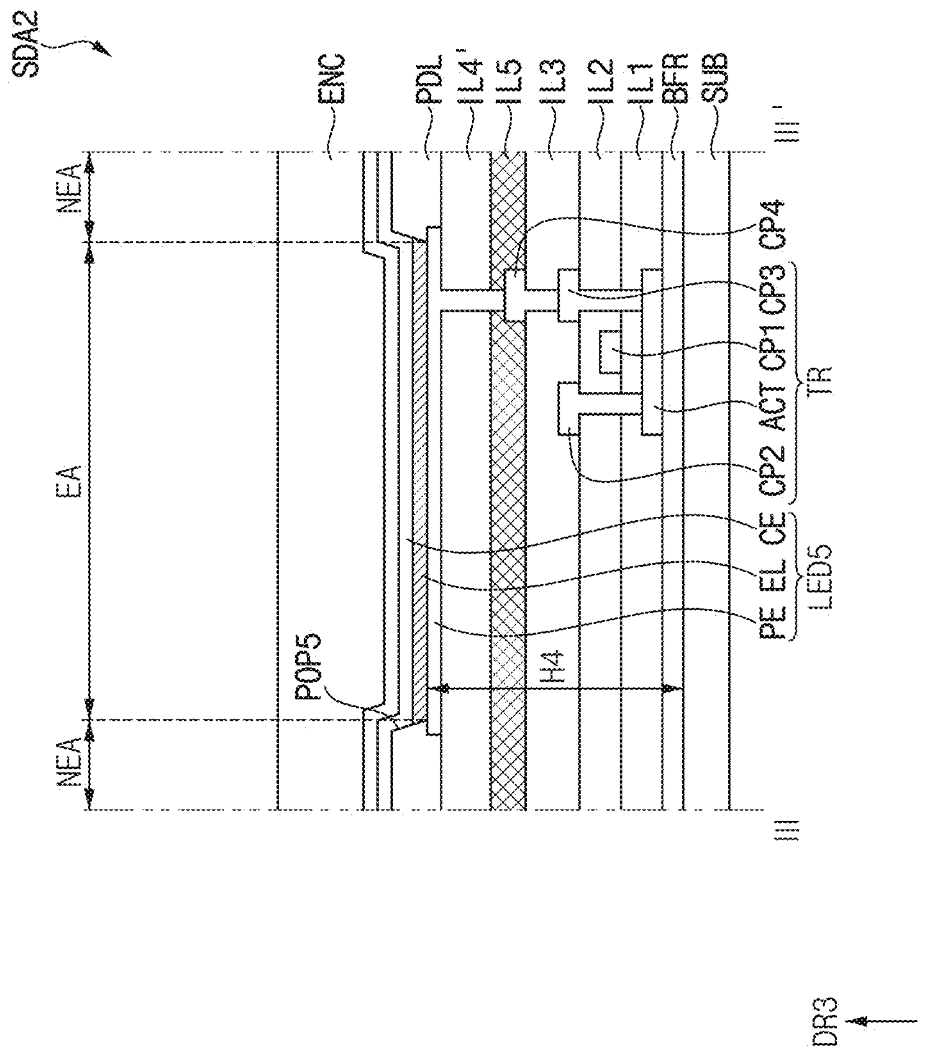
FIG. 13 is a cross-sectional view taken along line III-III' of FIG. 7 according to another embodiment.

FIG. 11 is a cross-sectional view taken along line I-I' of FIG. 7 according to another embodiment. FIG. 12 is a cross-sectional view taken along line II-II' of FIG. 7 according to another embodiment. FIG. 13 is a cross-sectional view taken along line III-III' of FIG. 7 according to another embodiment.

In an embodiment, for example, FIG. 11 may correspond to a cross-sectional view of FIG. 8, FIG. 12 may correspond to a cross-sectional view of FIG. 9, and FIG. 13 may correspond to a cross-sectional view of FIG. 10.

The display device 1 described with reference to FIGS. 11 to 13 may be substantially same as the display device 1 described with reference to FIGS. 8 to 10 except for including a fourth insulating layer IL4' instead of the fourth insulating layer IL4 and further including a fifth insulating layer IL5. In addition, the fourth insulating layer IL4' may be substantially same as the fourth insulating layer IL4 described with reference to FIGS. 8 to 10 except for defining a hole HL instead of the trench TRC. Therefore, redundant descriptions are omitted or simplified.

Referring to FIGS. 11 to 13, in an embodiment, the display device 1 may include the fourth insulating layer IL4' and the fifth insulating layer IL5.

The fifth insulating layer IL5 may be disposed between the third insulating layer IL3 and the fourth insulating layer IL4'. That is, the fifth insulating layer IL5 may be disposed on the fourth conductive pattern CP4. In other words, the fifth insulating layer IL5 may cover the fourth conductive pattern CP4. The fifth insulating layer IL5 may include an organic insulating material and/or an inorganic insulating material.

The fourth insulating layer IL4' may be disposed on the fifth insulating layer IL5. In an embodiment, the fourth insulating layer IL4' may have at least one hole HL located in the first sub-display area SDA1. The hole HL may penetrate the fourth insulating layer IL4'. That is, the hole HL may expose a portion of the fifth insulating layer IL5. As the fourth insulating layer IL4' has the hole HL, a step may be formed between an upper surface of the fourth insulating layer IL4' and an upper surface of the fifth insulating layer IL5 in the first sub-display area SDA1.

The pixel electrode PE may be disposed on the fourth insulating layer IL4' and the fifth insulating layer IL5. The pixel electrode PE may contact the fourth conductive pattern CP4 through a contact hole defined in the fourth insulating layer IL4' and/or the fifth insulating layer IL5.

As illustrated in FIGS. 11 and 12, in the first sub-display area SDA1, the pixel electrode PE of the first light emitting element LED1 and the pixel electrode PE of the second light emitting element LED2 may be disposed in the hole HL of the fourth insulating layer IL4'. That is, the pixel electrode PE of the first light emitting element LED1 and the pixel electrode PE of the second light emitting element LED2 may be directly disposed on the fifth insulating layer IL5. On the other hand, the pixel electrode PE of the third light emitting element LED3 may not be disposed in the hole HL. That is, the pixel electrode PE of the third light emitting element LED6 may be directly disposed on the fourth insulating layer IL4'.

Accordingly, the pixel electrode PE of the third light emitting element LED3 may have a level different from at least one of the pixel electrode PE of the first light emitting element LED1 and the pixel electrode PE of the second light emitting element LED2.

In an embodiment, for example, the pixel electrode PE of the third light emitting element LED3 may disposed at a level different from the pixel electrode PE of the first light emitting element LED1 and the pixel electrode PE of the second light emitting element LED2, and the pixel electrode PE of the first light emitting element LED1 and the pixel electrode PE of the second light emitting element LED2 may be disposed at the same level.

In other words, an upper surface of the pixel electrode PE of the first light emitting element LED1 may have a first height H1 from an upper surface of the substrate SUB, an upper surface of the pixel electrode PE of the second light emitting element LED2 may have a second height H2 equal to the first height H1 from the upper surface of the substrate SUB, and an upper surface of the pixel electrode PE of the third light emitting element LED3 may have a third height H3 different from the first height H1 and the second height H2 from the upper surface of the substrate SUB.

In an embodiment, for example, in the first sub-display area SDA1, the pixel electrode PE of the third light emitting element LED3 may be disposed at a level higher than a level at which the pixel electrode PE of the first light emitting element LED1 and the pixel electrode PE of the second light emitting element LED2 are disposed. In other words, the upper surface of the pixel electrode PE of the third light emitting element LED3 may have the third height H3 higher than the first height H1 and the second height H2 from the upper surface of the substrate SUB.

However, the present invention is not necessarily limited thereto, in an embodiment, if the pixel electrode PE of the third light emitting element LED3 disposes at a level different from at least one of the pixel electrode PE of the first light emitting element LED1 and the pixel electrode PE of the second light emitting element LED2, the pixel electrode PE of the first light emitting element LED1 and the pixel electrode PE of the second light emitting element LED2 may be disposed at different levels from each other.

That is, in an embodiment, if the upper surface of the pixel electrode PE of the third light emitting element LED3 has the third height H3 which is different from the first height H1 and the second height H2 from the upper surface of the substrate SUB, the first height H1 and the second height H2 may be different from each other.

As illustrated in FIG. 13, in the second sub-display area SDA2, the pixel electrode PE of the fifth light emitting element LED5 may not be disposed in the hole HL. Although not shown, the pixel electrode PE of the fourth light emitting element LED4 and the pixel electrode PE of the sixth light emitting element LED6 may also not be disposed in hole HL. That is, since the hole HL is not defined in the second sub-display area SDA2, the pixel electrode PE may not be disposed in the hole HL in the second sub-display area SDA2.

Accordingly, the pixel electrode PE of the fifth light emitting element LED5 may be disposed at the same level as the pixel electrode PE of the third light emitting element LED3. In other words, an upper surface of the pixel electrode PE of the fifth light emitting element LED5 may have a fourth height H4 equal to the third height H3 from the upper surface of the substrate SUB.

Although not illustrated, the pixel electrode PE of the fourth light emitting element LED4 and the pixel electrode PE of the sixth light emitting element LED6 may be also disposed at the same level as the pixel electrode PE of the third light emitting element LED3. That is, an upper surface of the pixel electrode PE of the fourth light emitting element LED4 may have the fourth height H4 equal to the third height H3 from the upper surface of the substrate SUB, and an upper surface of the pixel electrode PE of the sixth light emitting element LED6 may have the fourth height H4 equal to the third height H3 from the upper surface of the substrate SUB.

A portion of the pixel defining layer PDL may be disposed in the hole HL. In an embodiment, for example, as shown in FIGS. 11 and 12, a portion of the pixel defining layer PDL may cover an edge of the hole HL.

At least one of a first distance d1 from the upper surface of the pixel electrode PE of the first light emitting element LED1 to a lower surface of the light blocking layer LBL and a second distance d2 from the upper surface of the pixel electrode PE of the second light emitting element LED2 to the lower surface of the light blocking layer LBL may be different from a third distance d3 from the upper surface of the pixel electrode PE of the third light emitting element LED3 to the lower surface of the light blocking layer LBL.

In an embodiment, for example, as illustrated in FIGS. 11 and 12, the first distance d1 from the upper surface of the pixel electrode PE of the first light emitting element LED1 to the lower surface of the light blocking layer LBL may be equal to the second distance d2 from the upper surface of the pixel electrode PE of the second light emitting element LED2 to the lower surface of the light blocking layer LBL. In addition, the third distance d3 from the upper surface of the pixel electrode PE of the third light emitting element LED3 to the lower surface of the light blocking layer LBL may be different from the first distance d1 and the second distance d2.

In an embodiment, for example, as the pixel electrode PE of the first light emitting element LED1 and the pixel electrode PE of the second light emitting device LED2 are disposed in the hole HL of the fourth insulating layer IL4, and the pixel electrode PE of the third light emitting element LED3 is not disposed in the hole HL, the pixel electrode PE of the third light emitting element LED3 may be disposed at a level higher than the pixel electrode PE of the first light emitting element LED1 and the pixel electrode PE of the second light emitting element LED2. Accordingly, the third distance d3 from the upper surface of the pixel electrode PE of the third light emitting element LED3 to the lower surface of the light blocking layer LBL may be shorter than the first distance d1 from the upper surface of the pixel electrode PE of the first light emitting element LED1 to the lower surface of the light blocking layer LBL and the second distance d2 from the upper surface of the pixel electrode PE of the second light emitting element LED2 to the lower surface of the light blocking layer LBL.

However, the present invention is not necessarily limited thereto, and in an embodiment, if the third distance d3 is different from the first distance d1 and the second distances d2, the first distance d1 and the second distance d2 may be different from each other.

Figure 14:
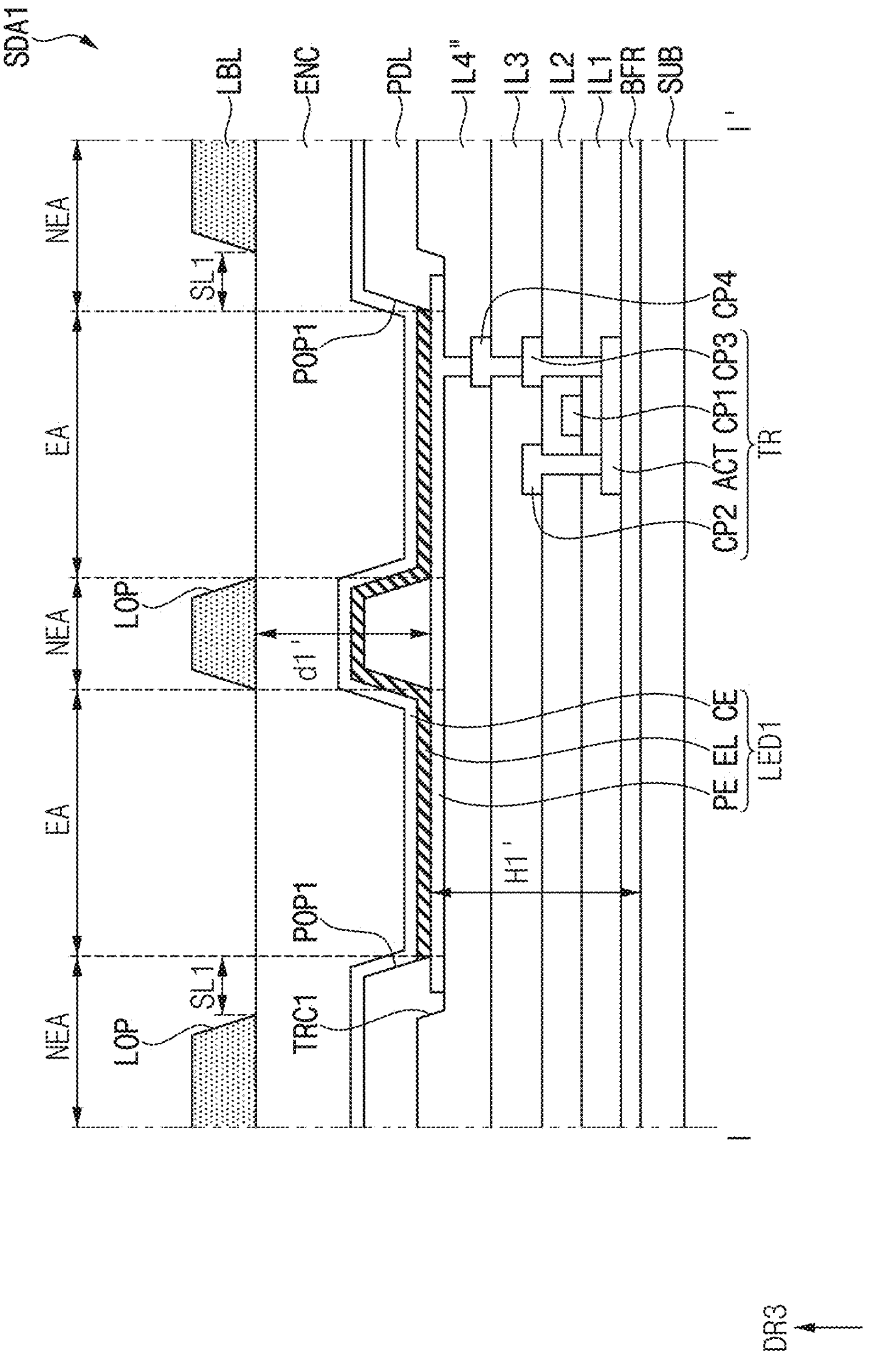
FIG. 14 is a cross-sectional view taken along line I-I' of FIG. 7 according to still another embodiment.
Figure 15:
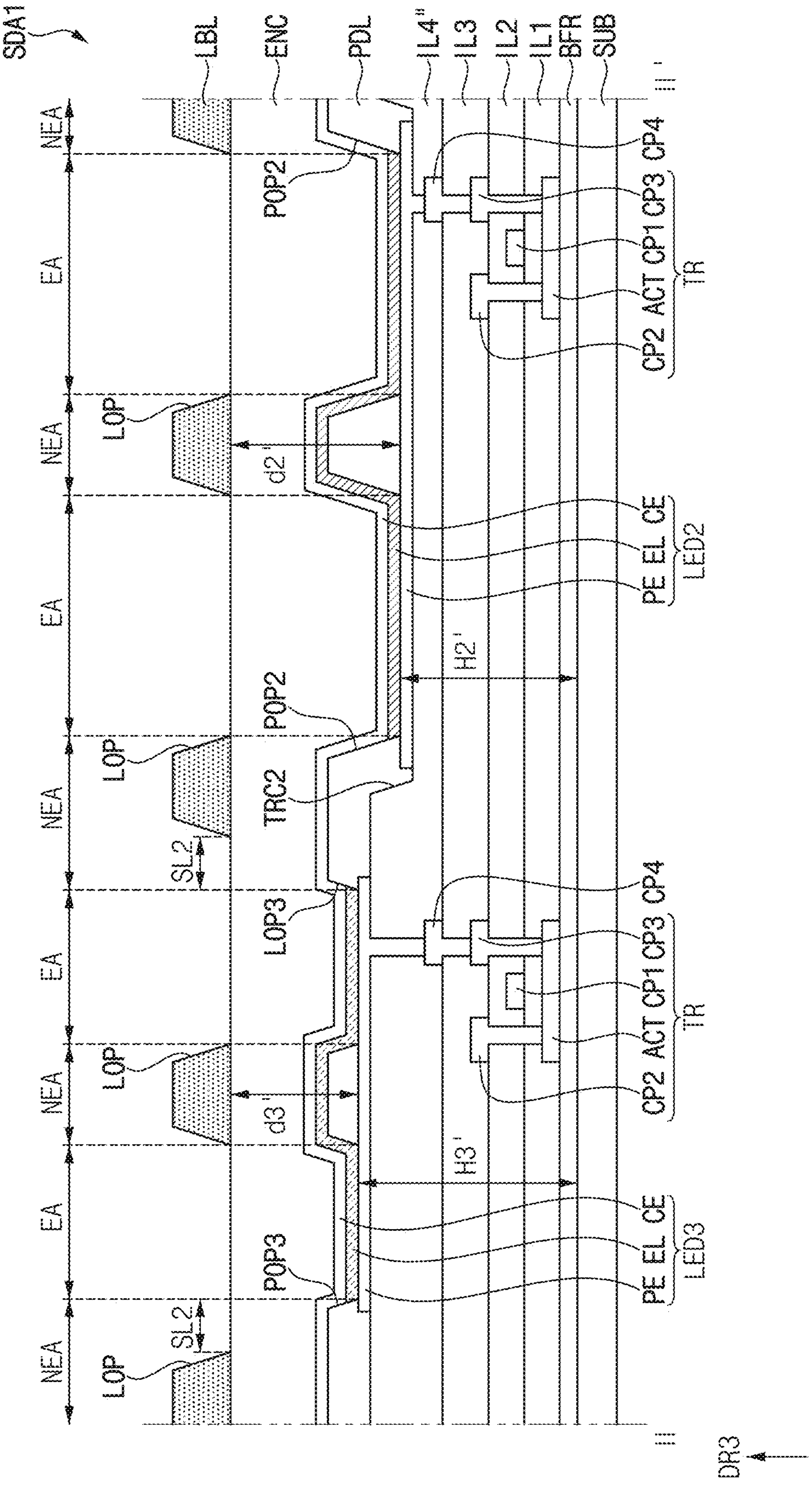
FIG. 15 is a cross-sectional view taken along line II-II' of FIG. 7 according to still another embodiment.
Figure 16:
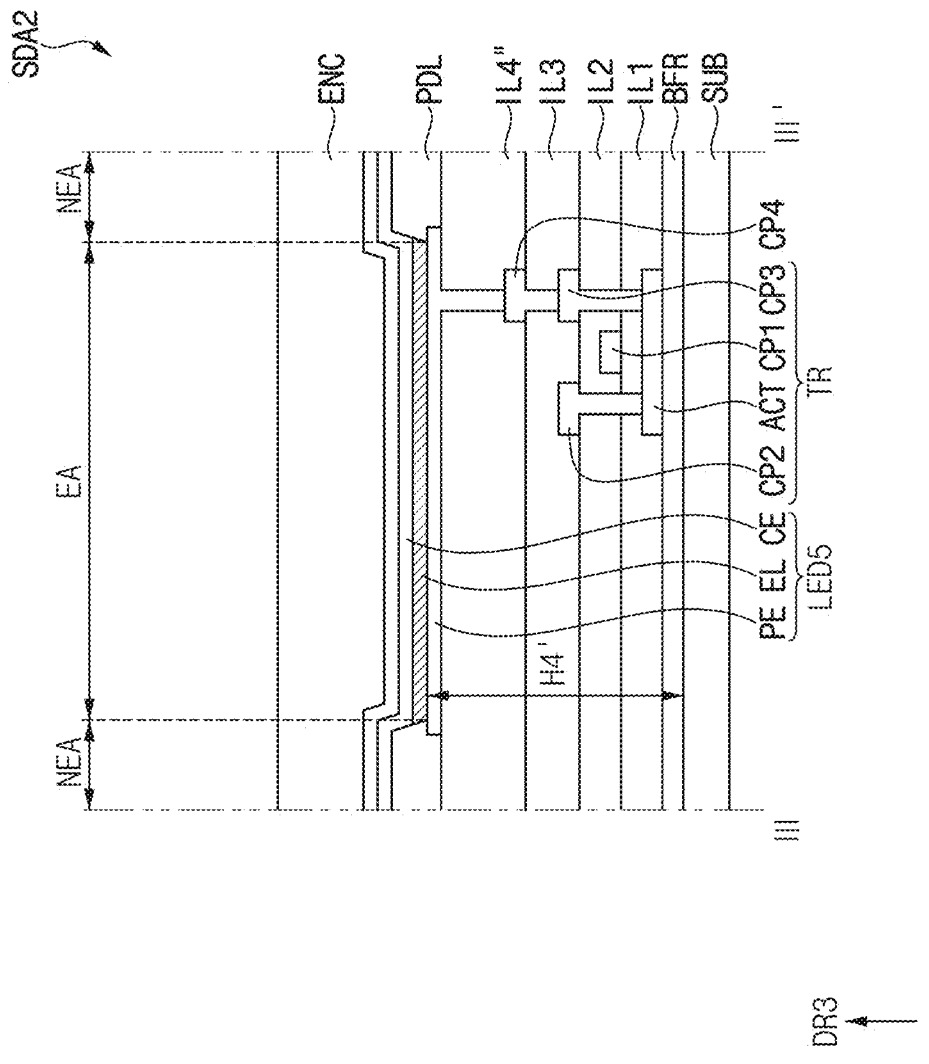
FIG. 16 is a cross-sectional view taken along line III-III' of FIG. 7 according to still another embodiment.

FIG. 14 is a cross-sectional view taken along line I-I' of FIG. 7 according to still another embodiment. FIG. 15 is a cross-sectional view taken along line II-II' of FIG. 7 according to still another embodiment. FIG. 16 is a cross-sectional view taken along line III-III' of FIG. 7 according to still another embodiment.

In an embodiment, for example, FIG. 14 may correspond to a cross-sectional view of FIG. 8, FIG. 15 may correspond to a cross-sectional view of FIG. 9, and FIG. 16 may correspond to a cross-sectional view of FIG. 10.

The display device 1 described with reference to FIGS. 14 to 16 may be substantially same as the display device 1 described with reference to FIGS. 8 to 10 except for including a fourth insulating layer IL4" instead of the fourth insulating layer IL4. In addition, the fourth insulating layer IL4" may be substantially same as the fourth insulating layer IL4 described with reference to FIGS. 8 to 10 except for defining a first trench TRC1 and a second trench TRC2 instead of the trench TRC. Therefore, redundant descriptions are omitted or simplified.

Referring to FIG. 14, in an embodiment, the display device 1 may include the fourth insulating layer IL4".

The fourth insulating layer IL4" may define a first trench TRC1 and a second trench TRC2 located in the first sub-display area SDA1. The first trench TRC1 and the second trench TRC2 may be defined as portions in which the fourth insulating layer IL4" is depressed to a specific point. That is, the first trench TRC1 and the second trench TRC2 may not expose components under the fourth insulating layer IL4". In an embodiment, for example, after applying a preliminary insulating layer on the third insulating layer IL3 and the fourth conductive pattern CP4, the preliminary insulating layer may be patterned using a halftone mask or the like to form the fourth insulating layer IL4" defining the first trench TRC1 and the second TRC2.

A depth at which the fourth insulating layer IL4" is depressed by the first trench TRC1 may be different from a depth at which the fourth insulating layer IL4" is depressed by the second trench TRC2. In an embodiment, for example, the depth at which the fourth insulating layer IL4" is depressed by the first trench TRC1 may be smaller than the depth at which the fourth insulating layer IL4" is depressed by the second trench TRC2. As the fourth insulating layer IL4" defines the first trench TRC1 and the second trench TRC2, an upper surface of the fourth insulating layer IL4" may have a step in the first sub-display area SDA1. That is, the fourth insulating layer IL4" may include first to third portions having different thicknesses due to the first trench TRC1 and the second trench TRC2.

As illustrated in FIGS. 14 and 15, in the first sub-display area SDA1, the pixel electrode PE of the first light emitting element LED1 may be disposed in the first trench TR1 of the fourth insulating layer IL4" and the pixel electrode PE of the second light emitting element LED2 may be disposed in the second trench TRC of the fourth insulating layer IL4". On the other hand, the pixel electrode PE of the third light emitting element LED3 may not be disposed in the first trench TRC1 and the second trench TRC2.

Accordingly, the pixel electrode PE of the first light emitting element LED1, the pixel electrode PE of the second light emitting element LED2, and the pixel electrode PE of the third light emitting element LED3 are disposed at different levels from each other.

In other words, the upper surface of the pixel electrode PE of the first light emitting element LED1 may have a first height H1' from the upper surface of the substrate SUB, the upper surface of the pixel electrode PE of the second light emitting element LED2 may have a second height H2' different from the first height H1' from the upper surface of the substrate SUB, and the upper surface of the pixel electrode PE of the third light emitting element LED3 may have a third height H3' different from the first height H1' and the second height H2' from the upper surface of the substrate SUB.

In an embodiment, for example, in the first sub-display area SDA1, the pixel electrode PE of the third light emitting element LED3 may be disposed at a level higher than a level at which the pixel electrode PE of the first light emitting element LED1 and the pixel electrode PE of the second light emitting element LED2 are disposed. In addition, the pixel electrode PE of the first light emitting element LED1 may be disposed at a level higher than a level at which the pixel electrode PE of the second light emitting element LED2 are disposed.

In other words, the upper surface of the pixel electrode PE of the third light emitting element LED3 may have the third height H3' higher than the first height H1' and the second height H2' from the upper surface of the substrate SUB, and the upper surface of the pixel electrode PE of the first light emitting element LED1 may have the first height H1' higher than the second height H2' from the upper surface of the substrate SUB.

As illustrated in FIG. 16, in the second sub-display area SDA2, the pixel electrode PE of the fifth light emitting element LED5 may not be disposed in the first trench TRC1 and the second trench TRC2. Although not shown, the pixel electrode PE of the fourth light emitting element LED4 and the pixel electrode PE of the sixth light emitting element LED6 may also not be disposed in the first trench TRC1 and the second trench TRC2. That is, since the first trench TRC1 and the second trench TRC2 is not defined in the second sub-display area SDA2, the pixel electrode PE may not be disposed in the first trench TRC1 and the second trench TRC2 in the second sub-display area SDA2.

Accordingly, the pixel electrode PE of the fifth light emitting element LED5 may be disposed at the same level as the pixel electrode PE of the third light emitting element LED3. In other words, the upper surface of the pixel electrode PE of the fifth light emitting element LED5 may have a fourth height H4' equal to the third height H3' from the upper surface of the substrate SUB.

Although not illustrated, the pixel electrode PE of the fourth light emitting element LED4 and the pixel electrode PE of the sixth light emitting element LED6 may be also disposed at the same level as the pixel electrode PE of the third light emitting element LED3. That is, the upper surface of the pixel electrode PE of the fourth light emitting element LED4 may have the fourth height H4' equal to the third height H3 from the upper surface of the substrate SUB, and the upper surface of the pixel electrode PE of the sixth light emitting element LED6 may have the fourth height H4' equal to the third height H3 from the upper surface of the substrate SUB.

A portion of the pixel defining layer PDL may be disposed in the first trench TRC1 and the second trench TRC2. In an embodiment, for example, as shown in FIGS. 14 and 15, a portion of the pixel defining layer PDL may cover the edges of each of the first trench TRC1 and the second trench TRC2.

At least one of a first distance d1' from the upper surface of the pixel electrode PE of the first light emitting element LED1 to the lower surface of the light blocking layer LBL, a second distance d2' from the upper surface of the pixel electrode PE of the second light emitting element LED2 to the lower surface of the light blocking layer LBL, and a third distance d3' from the upper surface of the pixel electrode PE of the third light emitting element LED3 to the lower surface of the light blocking layer LBL may be different from each other.

In an embodiment, for example, as the pixel electrode PE of the first light emitting element LED1 is disposed in the first trench TRC1, the pixel electrode PE of the second light emitting device LED2 is disposed in the second trench TRC2, and the pixel electrode PE of the third light emitting element LED3 is not disposed in the first trench TRC1 and second trench TRC2, the pixel electrode PE of the third light emitting element LED3 may be disposed at a level higher than the pixel electrode PE of the first light emitting element LED1 and the pixel electrode PE of the second light emitting element LED2 and the pixel electrode PE of the first light emitting element LED1 may be disposed at a level higher than the pixel electrode PE of the second light emitting element LED2.

Accordingly, the third distance d3' from the upper surface of the pixel electrode PE of the third light emitting element LED3 to the lower surface of the light blocking layer LBL may be shorter than the first distance d1' from the upper surface of the pixel electrode PE of the first light emitting element LED1 to the lower surface of the light blocking layer LBL and the second distance d2' from the upper surface of the pixel electrode PE of the second light emitting element LED2 to the lower surface of the light blocking layer LBL, and the first distance d1' from the upper surface of the pixel electrode PE of the first light emitting element LED1 to the lower surface of the light blocking layer LBL may be shorter than the second distance d2' from the upper surface of the pixel electrode PE of the second light emitting element LED2 to the lower surface of the light blocking layer LBL. Each of the first to third distances d1 to d3 and d1' to d3' and the first to fourth heights H1 to H4 and H1' to H4' are measured in the third direction DR3 (e.g., the thickness direction of the substrate SUB).

According to embodiments, in the first sub-display area SDA1 where the light blocking layer LBL is disposed, the pixel electrode PE of the first light emitting element LED1, the pixel electrode PE of the second light emitting element LED2, and the pixel electrode PE of the third light emitting element LED3 may be disposed at different levels from each other. Accordingly, a distance from the upper surface of the pixel electrode PE of the first light emitting element LED1 to the lower surface of the light blocking layer LBL, a distance from the upper surface of the pixel electrode PE of the second light emitting element LED2 to the lower surface of the light blocking layer LBL, and a distance from the upper surface of the pixel electrode PE of the third light emitting element LED3 to the lower surface of the light blocking layer LBL may be different from each other.

In an embodiment, for example, when the size (planar area) of the third pixel opening POP3 is smaller than each of the size (planar area) of the first pixel opening POP1 and the size (planar area) of the second pixel opening POP2, and the size (planar area) of the first pixel opening POP1 is smaller than the size (planar area) of the second pixel opening POP2, a level at which the pixel electrode PE of the third light emitting element LED3 may be higher than a level at which the pixel electrode PE of the first light emitting element LED1 is disposed and a level at which the pixel electrode PE of the second light emitting element LED2 is disposed.

In other words, a distance from the upper surface of the pixel electrode PE of the third light emitting element LED3 to the lower surface of the light blocking layer LBL may be shorter than a distance from the upper surface of the pixel electrode PE of the first light emitting element LED1 to the lower surface of the light blocking layer LBL and a distance from the upper surface of the pixel electrode PE of the second light emitting element LED2 to the lower surface of the light blocking layer LBL, and the distance from the upper surface of the pixel electrode PE of the first light emitting element LED1 to the lower surface of the light blocking layer LBL may be shorter than the distance from the upper surface of the pixel electrode PE of the second light emitting element LED2 to the lower surface of the light blocking layer LBL.

That is, in the first sub-display area SDA1, considering difference of sizes (planar areas) between the first to third pixel openings POP1, POP2, and POP3, difference between levels at which corresponding pixel electrodes PE are disposed may be realize. That is, difference between the distance from the upper surface of the pixel electrode PE of the first light emitting element LED1 to the lower surface of the light blocking layer LBL, the distance from the upper surface of the pixel electrode PE of the second light emitting element LED2 to the lower surface of the light blocking layer LBL, and the distance from the upper surface of the pixel electrode PE of the third light emitting element LED3 to the lower surface of the light blocking layer LBL may be realized. Accordingly, luminance deviation for each azimuth of the display device 1 due to difference of sizes (planar areas) between the first to third pixel openings POP1, POP2, and POP3 may be reduced or prevented. That is, in the private driving mode, the luminance deviation for each azimuth of the display device 1 may be reduced or prevented. Accordingly, the display quality of the display device 1 may be improved. Additionally, a viewing angle may be more easily adjusted in the private driving mode. Therefore, the viewing angle adjustment effect may be improved.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display device comprising:
a substrate including a first area including an emission area and a non-emission area;
first to third light emitting elements disposed in the first area on the substrate and configured to provide light of different colors to the emission area of the first area;
a pixel defining layer disposed in the non-emission area on the substrate;
an encapsulation layer disposed on the first to third light emitting elements; and
a light blocking layer disposed in the first area on the encapsulation layer and defining emission openings corresponding to the first to third light emitting elements, and
wherein at least one of a first distance from an upper surface of a pixel electrode of the first light emitting element to a lower surface of the light blocking layer and a second distance from an upper surface of a pixel electrode of the second light emitting element to the lower surface of the light blocking layer is different from a third distance from an upper surface of a pixel electrode of the third light emitting element to the lower surface of the light blocking layer;
wherein the first light emitting element is configured to provide red light,
the second light emitting element is configured to provide blue light, and
the third light emitting element is configured to provide green light.

2. The display device of claim 1, wherein the third distance is shorter than each of the first distance and the second distance.

3. The display device of claim 1, wherein the upper surface of the pixel electrode of the first light emitting element has a first height from an upper surface of the substrate,
the upper surface of the pixel electrode of the second light emitting element has a second height from the upper surface of the substrate,
the upper surface of the pixel electrode of the third light emitting element has a third height from the upper surface of the substrate, and
at least one of the first height and the second height is different from the third height.

4. The display device of claim 3, wherein the third height is greater than each of the first height and the second height.

5. The display device of claim 3, further comprising:
a second area, of the substrate, including an emission area and a non-emission area; and
fourth to sixth light emitting elements disposed in the second area on the substrate, and configured to provide light of different colors to the emission area of the second area, and
wherein the light blocking layer is not disposed in the second area.

6. The display device of claim 5, wherein each of an upper surface of a pixel electrode of the fourth light emitting element, an upper surface of a pixel electrode of the fifth light emitting element, and an upper surface of a pixel electrode of the sixth light emitting element has a fourth height, equal to the third height, from the upper surface of the substrate.

7. The display device of claim 1, wherein the pixel defining layer defines a first pixel opening exposing a portion of the pixel electrode of the first light emitting element, a second pixel opening exposing a portion of the pixel electrode of the second light emitting element, and a third pixel opening exposing a portion of the pixel electrode of the third light emitting element, and
a planar area of the third pixel opening is smaller than each of a planar area of the first pixel opening and a planar area of the second pixel opening.

8. The display device of claim 1, further comprising:
a conductive pattern disposed under the first to third light emitting elements and in contact with the first to third light emitting elements; and
an insulating layer covering the conductive pattern and defining at least one trench located in the first area, and
wherein the pixel electrode of the first light emitting element and the pixel electrode of the second light emitting element are disposed in the trench.

9. The display device of claim 8, wherein a portion of the pixel defining layer is disposed in the trench.

10. The display device of claim 1, further comprising:
a conductive pattern disposed under the first to third light emitting elements and in contact with the first to third light emitting elements;
a first insulating layer covering the conductive pattern; and
a second insulating layer disposed on the first insulating layer and defining at least one hole exposing a portion of the first insulating layer in the first area, and
wherein the pixel electrode of the first light emitting element and the pixel electrode of the second light emitting element are disposed in the hole.

11. The display device of claim 10, wherein a portion of the pixel defining layer is disposed in the hole.

12. A display device comprising:
a substrate including a first area including an emission area and a non-emission area;
first to third light emitting elements disposed in the first area on the substrate and configured to provide light of different colors to the emission area of the first area;
a pixel defining layer disposed in the non-emission area on the substrate;
an encapsulation layer disposed on the first to third light emitting elements; and
a light blocking layer disposed in the first area on the encapsulation layer and defining emission openings corresponding to the first to third light emitting elements, and
wherein a first distance from an upper surface of a pixel electrode of the first light emitting element to a lower surface of the light blocking layer, a second distance from an upper surface of a pixel electrode of the second light emitting element to the lower surface of the light blocking layer, and a third distance from an upper surface of a pixel electrode of the third light emitting element to the lower surface of the light blocking layer are different from each other;
wherein the first light emitting element is configured to provide red light,
the second light emitting element is configured to provide blue light, and
the third light emitting element is configured to provide green light.

13. The display device of claim 12, wherein the third distance is shorter than each of the first distance and the second distance, and the second distance is shorter than the first distance.

14. The display device of claim 12, wherein the upper surface of the pixel electrode of the first light emitting element has a first height from an upper surface of the substrate, the upper surface of the pixel electrode of the second light emitting element has a second height from the upper surface of the substrate, the upper surface of the pixel electrode of the third light emitting element has a third height from the upper surface of the substrate, and the first height, the second height, and the third height are different from each other.

15. The display device of claim 14, wherein the third height is greater than each of the first height and the second height, and the second height is greater than the first height.

16. The display device of claim 12, wherein the pixel defining layer defines a first pixel opening exposing a portion of the pixel electrode of the first light emitting element, a second pixel opening exposing a portion of the pixel electrode of the second light emitting element, and a third pixel opening exposing a portion of the pixel electrode of the third light emitting element, and a planar area of the first pixel opening, a planar area of the second pixel opening, and a planar area of the third pixel opening are different from each other.

17. The display device of claim 12, further comprising:

a second area, of the substrate, including an emission area and a non-emission area; and fourth to sixth light emitting elements disposed in the second area on the substrate, and configured to provide light of different colors to the emission area of the second area, and wherein the light blocking layer is not disposed in the second area.

18. The display device of claim 12, further comprising:

a conductive pattern disposed under the first to third light emitting elements and in contact with the first to third light emitting elements; and an insulating layer covering the conductive pattern and defining at least one trench located in the first area, and wherein two of the pixel electrode of the first light emitting element, the pixel electrode of the second light emitting element, and the pixel electrode of the third light emitting element are disposed in the trench.

19. The display device of claim 18, wherein a portion of the pixel defining layer is disposed in the trench.

* * * * *